(12) United States Patent
Hoshi et al.

(10) Patent No.: US 9,340,869 B2
(45) Date of Patent: May 17, 2016

(54) FORMED ARTICLE, METHOD FOR PRODUCING THE SAME, ELECTRONIC DEVICE MEMBER, AND ELECTRONIC DEVICE

(75) Inventors: Shinichi Hoshi, Kawagoe (JP); Takeshi Kondo, Tokyo (JP); Yuuta Suzuki, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 13/055,274

(22) PCT Filed: Aug. 18, 2009

(86) PCT No.: PCT/JP2009/064457
§ 371 (c)(1),
(2), (4) Date: Apr. 19, 2011

(87) PCT Pub. No.: WO2010/021326
PCT Pub. Date: Feb. 25, 2010

(65) Prior Publication Data
US 2011/0189450 A1    Aug. 4, 2011

(30) Foreign Application Priority Data

Aug. 19, 2008    (JP) ................................. 2008-210713

(51) Int. Cl.
*B32B 7/02*    (2006.01)
*B32B 9/04*    (2006.01)
(Continued)

(52) U.S. Cl.
CPC . *C23C 14/48* (2013.01); *B05D 3/00* (2013.01); *B32B 7/00* (2013.01); *C23C 14/00* (2013.01); *C23C 14/562* (2013.01); *B05D 1/62* (2013.01); *Y10T 428/24967* (2015.01); *Y10T 428/31663* (2015.04)

(58) Field of Classification Search
None
See application file for complete search history.

(56) References Cited

U.S. PATENT DOCUMENTS 5,143,747 A    9/1992    Matossian et al.
5,458,753 A    10/1995    Sato et al.
(Continued)

FOREIGN PATENT DOCUMENTS

DE    10 2004 004 177 A1    9/2005
EP    0 285 870 A2    10/1988
(Continued)

OTHER PUBLICATIONS

International Search Report for PCT/JP2009/064457, dated Dec. 1, 2009.
(Continued)

*Primary Examiner* — David Sample
*Assistant Examiner* — Nicole T Gugliotta
(74) *Attorney, Agent, or Firm* — Birch, Stewart, Kolasch & Birch, LLP

(57) ABSTRACT

A formed article includes a gas barrier layer that is formed of a material that includes at least an oxygen atom, a carbon atom, and a silicon atom, the gas barrier layer having an oxygen atom content that gradually decreases from the surface of the gas barrier layer in the depth direction, and having a carbon atom content that gradually increases from the surface of the gas barrier layer in the depth direction. An electronic device member includes the formed article, and an electronic device includes the electronic device member. The formed article exhibits an excellent gas barrier capability and excellent transparency.

7 Claims, 8 Drawing Sheets

(51) Int. Cl.
  *C08G 77/00*  (2006.01)
  *C08K 3/36*  (2006.01)
  *C23C 14/48*  (2006.01)
  *B05D 3/00*  (2006.01)
  *B32B 7/00*  (2006.01)
  *C23C 14/00*  (2006.01)
  *C23C 14/56*  (2006.01)
  *B05D 1/00*  (2006.01)

(56) References Cited

U.S. PATENT DOCUMENTS

| | | | |
|---|---|---|---|
| 5,907,382 | A | 5/1999 | Kajiura et al. |
| 5,989,945 | A | 11/1999 | Yudasaka et al. |
| 6,194,328 | B1 | 2/2001 | Chen et al. |
| 6,251,981 | B1 | 6/2001 | Tanaka et al. |
| 6,300,641 | B1 | 10/2001 | Koh et al. |
| 6,352,931 | B1 | 3/2002 | Seta et al. |
| 6,416,817 | B1 | 7/2002 | Rangwalla et al. |
| 6,828,381 | B1 | 12/2004 | Armbrust et al. |
| 2001/0018491 | A1 | 8/2001 | Shiono et al. |
| 2002/0034885 | A1 | 3/2002 | Shindo |
| 2002/0059899 | A1 | 5/2002 | Seta et al. |
| 2002/0063830 | A1 | 5/2002 | Callegari et al. |
| 2002/0102843 | A1 | 8/2002 | Seta et al. |
| 2003/0224611 | A1 | 12/2003 | Seta et al. |
| 2003/0228475 | A1 | 12/2003 | Komada |
| 2004/0046497 | A1 | 3/2004 | Schaepkens et al. |
| 2004/0116555 | A1 | 6/2004 | Naruse et al. |
| 2004/0146660 | A1 | 7/2004 | Goodwin et al. |
| 2004/0253451 | A1 | 12/2004 | Kawashima et al. |
| 2004/0265554 | A1 | 12/2004 | Miyadera et al. |
| 2005/0017633 | A1 | 1/2005 | Miyadera |
| 2005/0079380 | A1* | 4/2005 | Iwanaga ............... 428/688 |
| 2005/0082674 | A1 | 4/2005 | Seta et al. |
| 2005/0202259 | A1 | 9/2005 | Korevaar et al. |
| 2005/0287307 | A1 | 12/2005 | Singh et al. |
| 2006/0017162 | A1 | 1/2006 | Seta et al. |
| 2006/0232735 | A1 | 10/2006 | Hokazono et al. |
| 2007/0268089 | A1 | 11/2007 | McKenzie et al. |
| 2008/0018230 | A1* | 1/2008 | Yamada et al. ............ 313/498 |
| 2008/0096014 | A1 | 4/2008 | Griesser et al. |
| 2008/0318067 | A1 | 12/2008 | Itoh et al. |
| 2009/0021150 | A1 | 1/2009 | Kim et al. |
| 2009/0022907 | A1 | 1/2009 | Kim et al. |
| 2009/0110892 | A1 | 4/2009 | Erlat et al. |
| 2009/0130463 | A1 | 5/2009 | Albaugh et al. |
| 2009/0139564 | A1 | 6/2009 | Miyaji et al. |
| 2009/0148633 | A1* | 6/2009 | Inagaki et al. ............ 428/34.1 |
| 2009/0214882 | A1* | 8/2009 | Sakakura ............... 428/447 |
| 2009/0252975 | A1 | 10/2009 | Lee et al. |
| 2010/0003482 | A1 | 1/2010 | Fukuda |
| 2010/0003483 | A1 | 1/2010 | Fukuda |
| 2010/0216264 | A1 | 8/2010 | Matsumoto et al. |
| 2011/0185948 | A1 | 8/2011 | Uemura et al. |
| 2011/0189450 | A1 | 8/2011 | Hoshi et al. |
| 2011/0274933 | A1 | 11/2011 | Hoshi et al. |
| 2012/0064321 | A1 | 3/2012 | Suzuki et al. |
| 2012/0101221 | A1 | 4/2012 | Hoshi et al. |
| 2012/0108761 | A1 | 5/2012 | Hoshi et al. |
| 2012/0208086 | A1 | 8/2012 | Plieth et al. |
| 2012/0295120 | A1 | 11/2012 | Nagamoto et al. |

FOREIGN PATENT DOCUMENTS

| | | | |
|---|---|---|---|
| EP | 2 410 005 A1 | 1/2012 | |
| EP | 2 412 522 A1 | 2/2012 | |
| EP | 2 615 144 A1 | 7/2013 | |
| JP | 62-220330 A | 9/1987 | |
| JP | 05-185568 * | 7/1993 | ............ B32B 27/00 |
| JP | 5-185568 A | 7/1993 | |
| JP | 6-64105 A | 3/1994 | |
| JP | 6-187833 A | 7/1994 | |
| JP | 7-292321 A | 11/1995 | |
| JP | 08-045452 A | 2/1996 | |
| JP | 8-57560 A | 3/1996 | |
| JP | 8-174748 A | 7/1996 | |
| JP | 8-302043 A | 11/1996 | |
| JP | 09-010687 A | 1/1997 | |
| JP | 9-26755 A | 1/1997 | |
| JP | 09-123807 * | 5/1997 | ............ C08J 7/00 |
| JP | 9-124807 A | 5/1997 | |
| JP | 10-244613 A | 9/1998 | |
| JP | 10-249990 A | 9/1998 | |
| JP | 10-305542 A | 11/1998 | |
| JP | 2000-246830 A | 9/2000 | |
| JP | 2000-254996 A | 9/2000 | |
| JP | 2000-260870 A | 9/2000 | |
| JP | 2000-338901 A | 12/2000 | |
| JP | 2000-340166 A | 12/2000 | |
| JP | 2001-119051 A | 4/2001 | |
| JP | 2001-207259 A | 7/2001 | |
| JP | 2002-18246 A | 1/2002 | |
| JP | 2002-105676 A | 4/2002 | |
| JP | 2003-8179 A | 1/2003 | |
| JP | 2003-118029 A | 4/2003 | |
| JP | 2003-154596 A | 5/2003 | |
| JP | 2003-525995 A | 9/2003 | |
| JP | 2003-347570 A | 12/2003 | |
| JP | 2004-119138 A | 4/2004 | |
| JP | 2004-527642 A | 9/2004 | |
| JP | 2004-530790 A | 10/2004 | |
| JP | 2004-322489 A | 11/2004 | |
| JP | 2004-352966 A | 12/2004 | |
| JP | 2005-88431 A | 4/2005 | |
| JP | 2005-104025 A | 4/2005 | |
| JP | 2005-119155 A | 5/2005 | |
| JP | 2005-119160 A | 5/2005 | |
| JP | 2005-169994 A | 6/2005 | |
| JP | 2005-231039 A | 9/2005 | |
| JP | 2005-240061 A | 9/2005 | |
| JP | 2005-537963 A | 12/2005 | |
| JP | 2006-35737 A | 2/2006 | |
| JP | 2006-52376 A | 2/2006 | |
| JP | 2006-052376 A | 2/2006 | |
| JP | 2006-070238 * | 3/2006 | ............ C08J 7/00 |
| JP | 2006-70238 A | 3/2006 | |
| JP | 2006-123306 A | 5/2006 | |
| JP | 2006-123307 A | 5/2006 | |
| JP | 2006-264118 A | 10/2006 | |
| JP | 2007-22075 A | 2/2007 | |
| JP | 2007-42616 A | 2/2007 | |
| JP | 2007-65644 A | 3/2007 | |
| JP | 2007-237588 A | 9/2007 | |
| JP | 2007-528447 A | 10/2007 | |
| JP | 2007-283726 A | 11/2007 | |
| JP | 2008-15500 A | 1/2008 | |
| JP | 2008-504687 A | 2/2008 | |
| JP | 2008-49601 A | 3/2008 | |
| JP | 2008-62498 A | 3/2008 | |
| JP | 2008-174792 A | 7/2008 | |
| JP | 2008-204683 A | 9/2008 | |
| JP | 2008-235165 A | 10/2008 | |
| JP | 2008-246893 A | 10/2008 | |
| JP | 2008-246894 A | 10/2008 | |
| JP | 2008-270115 A | 11/2008 | |
| JP | 2009-110897 A | 5/2009 | |
| JP | 2009-199812 A | 9/2009 | |
| JP | 2009-252574 A | 10/2009 | |
| JP | 2009-287006 A | 12/2009 | |
| JP | 2011-718 A | 1/2011 | |
| WO | WO 2006/015757 A1 | 2/2006 | |
| WO | WO 2006/090602 * | 8/2006 | ............ B32B 23/00 |
| WO | WO 2007/040039 A1 | 4/2007 | |
| WO | WO 2007/044181 A2 | 4/2007 | |
| WO | WO 2008/096617 A1 | 8/2008 | |
| WO | WO 2010/002182 A2 | 1/2010 | |
| WO | WO 2010/021326 A1 | 2/2010 | |
| WO | WO 2010/024378 A1 | 3/2010 | |
| WO | WO 2010/067857 A1 | 8/2010 | |
| WO | WO 2010/107018 A1 | 9/2010 | |
| WO | WO 2010/134609 A1 | 11/2010 | |
| WO | WO 2010/134611 A1 | 11/2010 | |

(56) References Cited

FOREIGN PATENT DOCUMENTS

OTHER PUBLICATIONS

International Search Report for PCT/JP2011/051507 dated May 10, 2011, with English translation.
Osamu Nakagawara et al.; Moisture-resistant ZnO transparent conductive films with Ga heavy doping; Applied Physics Letters 89, 091904 (2006).
International Search Report dated Aug. 10, 2010 for PCT/JP2010/058668.
International Search Report, dated Feb. 9, 2010 for PCT/JP2009/070728.
International Search Report, dated Jun. 1, 2010 for PCT/JP2010/052058.
Kobayashi et al., "Surface modification of silicone sheets and tubes using plasma-based ion implantation," Surface & Coatings Technology, vol. 201, 2007, pp. 8039-8042.
U.S. Office Action dated Feb. 14, 2013 for U.S. Appl. No. 13/128,348.
U.S. Office Action dated Mar. 15, 2013 for U.S. Appl. No. 13/144,856.
U.S. Office Action dated Oct. 18, 2013 for U.S. Appl. No. 13/144,856.
Extended European Search Report, dated Feb. 5, 2014, for European Application No. 11762771.1.
International Search Report for PCT/JP2011/067046 mailed on Aug. 23, 2011.
United States Notice of Allowance for U.S. Appl. No. 13/823,688, dated Jun. 4, 2014.
United States Notice of Allowance, dated Jun. 24, 2014, for U.S. Appl. No. 13/256,143.
United States Office Action for U.S. Appl. No. 13/634,378 dated Feb. 19, 2014.
United States Office Action, dated Jan. 15, 2014, for U.S. Appl. No. 13/634,378.
Written Opinion of the International Search Authority for PCT/JP2011/067046 mailed on Aug. 23, 2011 (Japanese).
Restriction Requirement issued Oct. 3, 2014, in U.S. Appl. No. 13/818,050.
Bodo, P. et al., "Titanium deposition onto ion-bombarded and plasma-treated polydimethylsiloxane: Surface modification, interface and adhesion", Thin Solid Films, Elsevier-Sequoia, Feb. 1, 1986, vol. 136, No. 1, pp. 147-159.
Extended European Search Report for Application No. 10756100.3 dated Sep. 25, 2014.
Igarashi, A. et al., "Structure and morphology of diamond-like carbon coated on nylon 66/poly(phenylene ether) alloy", J. of Molecular Structure, Elsevier, Amsterdam, NL, vol. 788, No. 1-3, May 8, 2006, pp. 238-245.
Tsuji, H et al., "Improvement of polydimethylsiloxane guide tube for nerve regeneration treatment by carbon negative-ion implantation", Nuclear Instruments and Methods in Physics Research, Section B: Beam Interactions with Materials and Atoms, Elsevier, May 1, 2003, vol. 206, pp. 507-511.
Balabanov, S. et al., "Spectral distribution of UV range diffuse reflectivity for Si+ ion implanted polymers", J. of Physics: Conference Series, institute of Publishing, Bristol, vol. 113, No. 1, May 1, 2008.
R.V. Gelamo, et al., "Infrared spectroscopy investigation of various plasma-deposited polymer films irradiated with 170 keV He+ ions", Nuclear Inst. and Methods in Physics Res. B, vol. 249, 2006, pp. 162-166.
United States Office Action for copending U.S. Appl. No. 14/484,573 dated Feb. 5, 2015.
CAS Registry No. 151772 74 6, SciFinder, American Chemical Society (ACS) 2014.
United States Final Office Action for copending U.S. Appl. No. 13/321,687 dated Aug. 1, 2014.

Moriya et al., "Modification Effects on Ion-Implanted SiO2 Spin-on-Glass," J. Electrochem. Soc. (May 1993), vol. 140, No. 5, pp. 1442-1450.
Office Action issued Jun. 8, 2015, in U.S. Appl. No. 13/144,856.
Office Action issued Oct. 7, 2015, in U.S. Appl. No. 13/634,410.
Office Action issued Nov. 4, 2015, in U.S. Appl. No. 13/321,687.
Office Action issued Jun. 4, 2015, in U.S. Appl. No. 13/634,410.
Office Action issued May 28, 2015, in U.S. Appl. No. 13/128,348.
Office Action issued Feb. 12, 2015, in U.S. Appl. No. 13/818,050.
Office Action issued Aug. 19, 2015, in U.S. Appl. No. 13/818,050.
Nakano, et al., "Effects of Si-C Bond Content on Film Properties of Organic Spin-on Glass," J. Electrochem. Soc., vol. 142, No. 4, pp. 1303-1308, Apr. 1995.
Non-Final Office Action issued Dec. 2, 2015, in U.S. Appl. No. 13/144,856.
Non-Final Office Action issued Nov. 30, 2015, in U.S. Appl. No. 13/128,348.
Extended European Search Report for Application No. 11765502.7 dated Aug. 29, 2013.
International Search Report for International Application No. PCT/JP2010/055064 dated May 11, 2010.
International Search Report for International Application No. PCT/JP2011/057608 dated Apr. 26, 2011.
International Search Report for International Application No. PCT/JP2011/057610 dated Jul. 5, 2011.
International Search Report for International Application No. PCT/JP2011/071203 dated Nov. 8, 2011.
International Search Report for International Application No. PCT/JP2011/071208 dated Nov. 8, 2011.
International Search Report for International Application No. PCT/JP2011/071353 dated Nov. 8, 2011.
Schauer et al., "Luminescence as a tool for crosslinking determination in plasma polysilylenes prepared from organosilanes", Synthetic Metals, vol. 109, 2000, pp. 321-325.
United States Advisory Action for copending U.S. Appl. No. 13/128,348 dated Feb. 10, 2014.
United States Advisory Action for copending U.S. Appl. No. 13/144,856 dated Mar. 3, 2014.
United States Notice of Allowance for copending U.S. Appl. No. 13/256,143 dated Apr. 29, 2014.
United States Notice of Allowance for copending U.S. Appl. No. 13/826,954 dated Feb. 28, 2014.
United States Office Action for copending U.S. Appl. No. 13/128,348 dated Sep. 13, 2013.
United States Office Action for copending U.S. Appl. No. 13/256,143 dated Aug. 6, 2013.
United States Office Action for copending U.S. Appl. No. 13/256,143 dated Nov. 21, 2013.
United States Office Action for copending U.S. Appl. No. 13/321,687 dated Jan. 15, 2014.
United States Office Action for copending U.S. Appl. No. 13/321,687 dated Oct. 8, 2013.
United States Office Action for copending U.S. Appl. No. 13/823,688 dated Feb. 25, 2014.
United States Office Action for copending U.S. Appl. No. 13/823,688 dated Nov. 8, 2013.
United States Office Action for copending U.S. Appl. No. 13/826,954 dated Nov. 7, 2013.
Extended European Search Report issued Feb. 17, 2014, in European Patent Application No. 11826800.2.
Extended European Search Report issued Mar. 27, 2014, in European Patent Application No. 11818032.2.
Non-Final Office Action issued Jan. 29, 2016, in U.S. Appl. No. 13/634,713.
Final Office Action issued Jan. 15, 2016, in U.S. Appl. No. 14/484,573.
Office Action issued Feb. 12, 2016, in U.S. Appl. No. 13/818,050.

* cited by examiner

FORMED ARTICLE, METHOD FOR PRODUCING THE SAME, ELECTRONIC DEVICE MEMBER, AND ELECTRONIC DEVICE

TECHNICAL FIELD

The present invention relates to a formed article that exhibits an excellent gas barrier capability and excellent transparency, a method of producing the formed article, an electronic device member that includes the formed article, and an electronic device that includes the electronic device member.

BACKGROUND ART

In recent years, use of a transparent plastic film as a substrate instead of a glass sheet has been proposed for displays (e.g., liquid crystal display and electroluminescence (EL) display) in order to implement a reduction in thickness, a reduction in weight, an increase in flexibility, and the like. However, since a plastic film tends to allow steam, oxygen, and the like to pass through as compared with a glass sheet, elements provided in a display may deteriorate.

In order to solve this problem, Patent Document 1 discloses a flexible display substrate in which a transparent gas barrier layer formed of a metal oxide is stacked on a transparent plastic film.

However, since the transparent gas barrier layer formed of a metal oxide is stacked on the surface of the transparent plastic film by vapor deposition, ion plating, sputtering, or the like, cracks may occur in the gas barrier layer when the substrate is rounded or folded, so that the gas barrier capability may deteriorate.

Patent Document 2 discloses a gas barrier laminate that includes a plastic film, and a resin layer that contains a polyorganosilsesquioxane as the main component and is stacked on at least one side of the plastic film.

However, since it is necessary to further stack an inorganic compound layer in order to obtain a gas (e.g., oxygen and steam) barrier capability, the process becomes complicated, and the production cost increases. Moreover, toxic gas may be used.

Patent Document 1: JP-A-2000-338901
Patent Document 2: JP-A-2006-123307

DISCLOSURE OF THE INVENTION

Problems to be Solved by the Invention

The present invention was conceived in view of the above situation. An object of the present invention is to provide a formed article that exhibits an excellent gas barrier capability and excellent transparency, a method of producing the formed article, an electronic device member that includes the formed article, and an electronic device that includes the electronic device member.

Means for Solving the Problems

The inventors conducted extensive studies in order to achieve the above object. As a result, the inventors found that a formed article that includes a gas barrier layer that is formed of a material that includes at least an oxygen atom, a carbon atom, and a silicon atom, and has a configuration in which the oxygen atom content gradually decreases and the carbon atom content gradually increases from the surface of the gas barrier layer in the depth direction, exhibits an excellent gas barrier capability, excellent transparency, and excellent folding (bending) resistance. The inventors also found that a formed article that includes the above gas barrier layer can be conveniently and efficiently produced by implanting ions into a polyorganosiloxane compound-containing layer of a formed body that includes the polyorganosiloxane compound-containing layer in its surface area. These findings have led to the completion of the present invention.

A first aspect of the present invention provides the following formed article (see (1) to (10)).

(1) A formed article comprising a gas barrier layer that is formed of a material that includes at least an oxygen atom, a carbon atom, and a silicon atom, the gas barrier layer having an oxygen atom content that gradually decreases from the surface of the gas barrier layer in the depth direction, and having a carbon atom content that gradually increases from the surface of the gas barrier layer in the depth direction.

(2) The formed article according to (1), wherein the surface layer part of the gas barrier layer has an oxygen atom content of 10 to 70%, a carbon atom content of 10 to 70%, and a silicon atom content of 5 to 35%, based on the total content of oxygen atoms, carbon atoms, and silicon atoms.

(3) The formed article according to (1) or (2), wherein the surface layer part of the gas barrier layer has a peak position of binding energy of 2p electron of the silicon atom (hereinafter referred to as a silicon atom 2p electron binding energy peak position) determined by X-ray photoelectron spectroscopy (XPS) of 102 to 104 eV.

(4) The formed article according to any one of (1) to (3), comprising a polyorganosiloxane compound.

(5) The formed article according to (4), wherein the polyorganosiloxane compound is a polyorganosiloxane shown by the following formula (a) or (b),

[Chemical Formula 1]

[Chemical Formula 2]

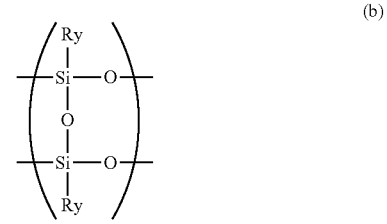

wherein Rx and Ry individually represent a hydrogen atom or a non-hydrolyzable group such as a substituted or unsubstituted alkyl group, a substituted or unsubstituted alkenyl group, or a substituted or unsubstituted aryl group, and a plurality of Rx in the formula (a) and a plurality of Ry in the formula (b) may respectively be either the same or different, provided that a case where both Rx represent a hydrogen atom is excluded.

(6) The formed article according to any one of (1) to (5), wherein the gas barrier layer is formed in the surface area of a polyorganosiloxane compound-containing layer having a thickness of 30 nm to 200 μm, and has a depth of 5 to 100 nm.

(7) The formed article according to any one of (1) to (6), wherein the gas barrier layer has been obtained by implanting ions into a polyorganosiloxane compound-containing layer.
(8) The formed article according to (7), wherein the ions have been implanted into the surface layer part of the polyorganosiloxane compound-containing layer.
(9) The formed article according to (7), wherein the ions have been obtained by ionizing at least one gas selected from the group consisting of hydrogen, nitrogen, oxygen, rare gas, and fluorocarbons.
(10) The formed article according to (7), wherein the ions have been implanted by plasma ion implantation.

A second aspect of the present invention provides the following method of producing a formed article (see (11) to (16)).
(11) A method of producing the formed article according to any one of (1) to (10), the method comprising implanting ions into a polyorganosiloxane compound-containing layer of a formed body that includes the polyorganosiloxane compound-containing layer in its surface area.
(12) The method according to (11), wherein the ions are obtained by ionizing at least one gas selected from the group consisting of hydrogen, nitrogen, oxygen, rare gas, and a fluorocarbon.
(13) The method according to (11) or (12), wherein the ions are implanted by plasma ion implantation.
(14) The method according to any one of (11) to (13), wherein the ions are implanted into the polyorganosiloxane compound-containing layer while transferring a long formed body that includes the polyorganosiloxane compound-containing layer in its surface area in a given direction.

A third aspect of the present invention provides the following electronic device member (see (15)).
(15) An electronic device member comprising the formed article according to any one of (1) to (10).

A fourth aspect of the present invention provides the following electronic device (see (16)).
(16) An electronic device comprising the electronic device member according to (15).

Effects of the Invention

The above formed article exhibits an excellent gas barrier capability, excellent folding resistance, and excellent transparency.

The above method can safely and conveniently produce the above formed article that exhibits an excellent gas barrier capability. Moreover, an increase in area can be easily achieved at low cost as compared with an inorganic film deposition.

The above electronic device member exhibits an excellent gas barrier capability and excellent transparency.

Figure 1:
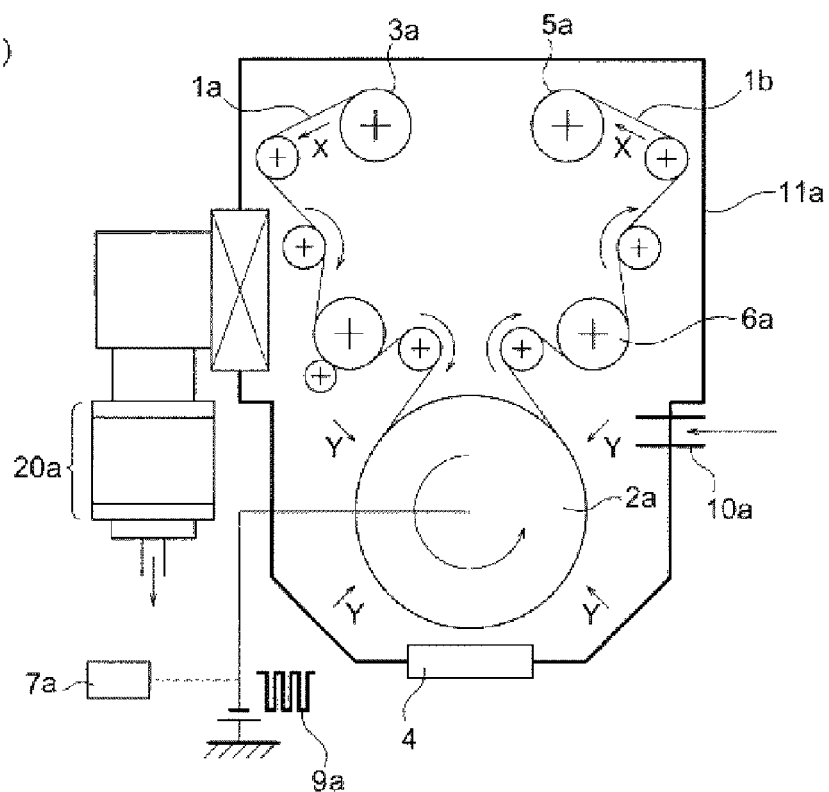
FIG. 1 is a view showing a schematic configuration of a plasma ion implantation apparatus.
Figure 1:
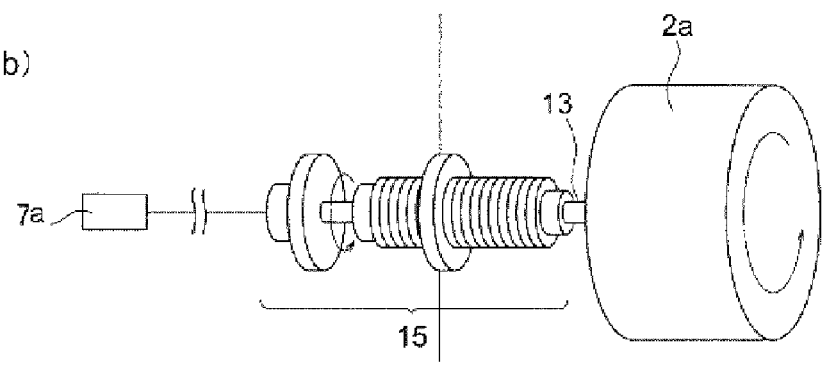

EXPLANATION OF SYMBOLS 1a, 1c: film-shaped formed body, 1b, 1d: film-shaped formed article, 2a, 2b: rotary can, 3a, 3b: feed roll, 4: plasma discharge electrode, 5a, 5b: wind-up roll, 6a, 6b: transfer roll, 7a, 7b: pulse power supply, 9a, 9b: high-voltage pulse, 10a, 10b: gas inlet, 11a, 11b: chamber, 13: center shaft, 15: high-voltage application terminal, 20a, 20b: oil diffusion pump

DESCRIPTION OF EXEMPLARY EMBODIMENTS

The formed article, the method of producing a formed article, the electronic device member, and the electronic device according to the present invention are described in detail in below.
1) Molded Article
A formed article of the present invention includes a gas barrier layer that is formed of a material that includes at least an oxygen atom, a carbon atom, and a silicon atom, the gas barrier layer having an oxygen atom content that gradually decreases from the surface of the gas barrier layer in the depth direction, and having a carbon atom content that gradually increases from the surface of the gas barrier layer in the depth direction.

The material that includes at least an oxygen atom, a carbon atom, and a silicon atom is not particularly limited insofar as the material is a polymer that includes at least an oxygen atom, a carbon atom, and a silicon atom. From the viewpoint of obtaining a more excellent gas barrier capability, it is preferable that the surface layer part of the gas barrier layer have an oxygen atom content of 10 to 70%, a carbon atom content of 10 to 70%, and a silicon atom content of 5 to 35%, based on the total content (=100%) of oxygen atoms, carbon atoms, and silicon atoms. It is more preferable that the surface layer part of the gas barrier layer have an oxygen atom content of 15 to 65%, a carbon atom content of 15 to 65%, and a silicon atom content of 10 to 30%. The oxygen atom content, the carbon atom content, and the silicon atom content are measured by the method described in the examples.

The area where the oxygen atom content gradually decreases and the carbon atom content gradually increases from the surface in the depth direction is an area that corresponds to the gas barrier layer. The thickness of the gas barrier layer is normally 5 to 100 nm, and preferably 10 to 50 nm. Examples of the gas barrier layer include a layer obtained by implanting ions into a polyorganosiloxane compound-containing layer (hereinafter may be referred to as "implanted layer"), and a layer obtained by subjecting a polyorganosiloxane compound-containing layer to a plasma process (described later).

It is preferable that the surface layer part of the gas barrier layer have a silicon atom 2p electron binding energy peak position determined by X-ray photoelectron spectroscopy (XPS) of 102 to 104 eV.

For example, a polydimethylsiloxane layer has a silicon atom 2p electron binding energy peak position determined by X-ray photoelectron spectroscopy (XPS) of about 101.5 eV. On the other hand, the surface layer part of an ion-implanted layer (gas barrier layer) obtained by implanting argon ions into the polydimethylsiloxane layer has a silicon atom 2p electron binding energy peak position determined by X-ray photoelectron spectroscopy (XPS) of about 103 eV. This value is almost equal to that of a known silicon-containing polymer that has a gas barrier capability (e.g., glass or silicon dioxide film) (glass has a silicon atom 2p electron binding energy peak position determined by X-ray photoelectron spectroscopy (XPS) of about 102.5 eV, and a silicon dioxide film has a silicon atom 2p electron binding energy peak position determined by X-ray photoelectron spectroscopy (XPS) of about 103 eV). Consequently, it seems that the formed article exhibits an excellent gas barrier capability, since the formed article of the present invention, in which the surface layer part of the gas barrier layer has a silicon atom 2p electron binding energy peak position of 102 to 104 eV, has a structure identical with or similar to that of glass or a silicon dioxide film. The silicon atom 2p electron binding energy peak position is measured by the method described in the examples.

The formed article of the present invention preferably includes a polyorganosiloxane compound. It is preferable that the gas barrier layer be formed in the surface area of a polyorganosiloxane compound-containing layer having a thickness of 30 nm to 200 μm, and have a depth of 5 to 100 nm, and more preferably 30 to 50 nm.

It is more preferable that the gas barrier layer has been obtained by implanting ions into a polyorganosiloxane compound-containing layer.

The main chain structure of the polyorganosiloxane compound used for the formed article of the present invention is not particularly limited. The main chain structure of the polyorganosiloxane compound may be linear, ladder-like, or polyhedral.

Examples of the linear main chain structure of the polyorganosiloxane compound include a structure shown by the following formula (a). Examples of the ladder-like main chain structure of the polyorganosiloxane compound include a structure shown by the following formula (b). Examples of the polyhedral main chain structure of the polyorganosiloxane compound include a structure shown by the following formula (c).

[Chemical Formula 3]

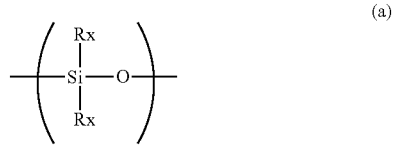

(a)

[Chemical Formula 4]

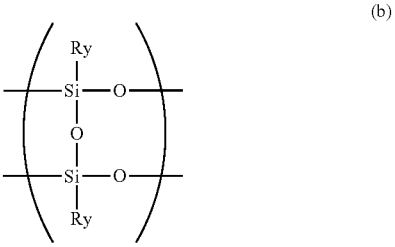

(b)

[Chemical Formula 5]

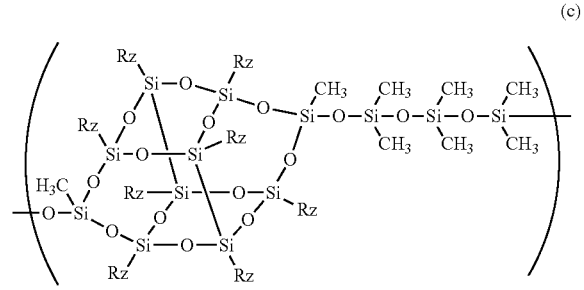

(c)

wherein Rx, Ry, and Rz individually represent a hydrogen atom or a non-hydrolyzable group such as a substituted or unsubstituted alkyl group, a substituted or unsubstituted alkenyl group, or a substituted or unsubstituted aryl group, and a plurality of Rx in the formula (a), a plurality of Ry in the formula (b), and a plurality of Rz in the formula (c) may respectively be either the same or different, provided that a case where both Rx represent a hydrogen atom is excluded.

Examples of the substituted or unsubstituted alkyl group include alkyl groups having 1 to 10 carbon atoms (e.g., methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group, and n-octyl group).

Examples of the alkenyl group include alkenyl groups having 2 to 10 carbon atoms (e.g., vinyl group, 1-propenyl group, 2-propenyl group, 1-butenyl group, 2-butenyl group, and 3-butenyl group).

Examples of a substituent for the alkyl group and the alkenyl group include halogen atoms such as a fluorine atom, a chlorine atom, a bromine atom, and an iodine atom; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

Examples of the aryl group include aryl groups having 6 to 10 carbon atoms (e.g., phenyl group, 1-naphthyl group, and 2-naphthyl group).

Examples of a substituent for the aryl group include halogen atoms such as a fluorine atom, a chlorine atom, a bromine atom, and an iodine atom; alkyl groups having 1 to 6 carbon atoms, such as a methyl group and an ethyl group; alkoxy groups having 1 to 6 carbon atoms, such as a methoxy group and an ethoxy group; a nitro group; a cyano group; a hydroxyl group; a thiol group; an epoxy group; a glycidoxy group; a (meth)acryloyloxy group; substituted or unsubstituted aryl groups such as a phenyl group, a 4-methylphenyl group, and a 4-chlorophenyl group; and the like.

It is preferable that Rx, Ry, and Rz individually represent a substituted or unsubstituted alkyl group having 1 to 6 carbon atoms or a phenyl group, and particularly preferably a methyl group, an ethyl group, a propyl group, a 3-glycidoxypropyl group, or a phenyl group.

Note that a plurality of Rx in the formula (a), a plurality of Ry in the formula (b), and a plurality of Rz in the formula (c) may respectively be either the same or different.

The polyorganosiloxane compound is preferably a linear compound shown by the formula (a) or a ladder-like compound shown by the formula (b), and particularly preferably a linear compound shown by the formula (a) in which Rx represent a methyl group or a phenyl group, or a ladder-like compound shown by the formula (b) in which Ry represent a methyl group, a propyl group, a 3-glycidoxypropyl group, or a phenyl group, from the viewpoint of availability and a capability to form an implanted layer that exhibits an excellent gas barrier capability.

The polyorganosiloxane compound may be obtained by a known method that polycondenses a silane compound that includes a hydrolyzable functional group.

The silane compound may be appropriately selected depending on the structure of the target polyorganosiloxane compound. Specific examples of a preferable silane compound include bifunctional silane compounds such as dimethyldimethoxysilane, dimethyldiethoxysilane, diethyldimethoxysilane, and diethyldiethoxysilane; trifunctional silane compounds such as methyltrimethoxysilane, methyltriethoxysilane, ethyltrimethoxysilane, ethyltriethoxysilane, n-propyltrimethoxysilane, n-butyltriethoxysilane, 3-glycidoxypropyltrimetoxysilane, phenyltrimethoxysilane, phenyltriethoxysilane, and phenyldiethoxymethoxysilane; tetrafunctional silane compounds such as tetramethoxysilane, tetraethoxysilane, tetra-n-propoxysilane, tetraisopropoxysilane, tetra-n-butoxysilane, tetra-t-butoxysilane, tetra-s-butoxysilane, methoxytriethoxysilane, dimethoxydiethoxysilane, and trimethoxyethoxysilane; and the like.

A product commercially available as a release agent, an adhesive, a sealant, a paint, or the like may be directly used as the polyorganosiloxane compound.

The polyorganosiloxane compound-containing layer may include a component other than a polyorganosiloxane compound insofar as the object of the present invention can be achieved. Examples of a component other than a polyorganosiloxane compound include a curing agent, another polymer, an aging preventive, a light stabilizer, a flame retardant, and the like.

The content of the polyorganosiloxane compound in the polyorganosiloxane compound-containing layer is preferably 50 wt % or more, more preferably 70 wt % or more, and particularly preferably 90 wt % or more, from the viewpoint of obtaining an implanted layer that exhibits an excellent gas barrier capability.

The polyorganosiloxane compound-containing layer may be formed by an arbitrary method. For example, the polyorganosiloxane compound-containing layer may be formed by applying a solution that includes at least one polyorganosiloxane compound, an optional component, and a solvent to an appropriate substrate, drying the resulting film, and optionally heating the dried film.

The thickness of the polyorganosiloxane compound-containing layer is not particularly limited, but is normally 30 nm to 200 μm, and preferably 50 nm to 100 μm.

The implanted layer is obtained by implanting ions into the polyorganosiloxane compound-containing layer.

The dose may be appropriately determined depending on the usage of the formed article (e.g., gas barrier capability and transparency), and the like.

Examples of ions implanted include rare gases such as argon, helium, neon, krypton, and xenon; ions of fluorocarbons, hydrogen, nitrogen, oxygen, carbon dioxide, chlorine, fluorine, sulfur, and the like; ions of conductive metals such as gold, silver, copper, platinum, nickel, palladium, chromium, titanium, molybdenum, niobium, tantalum, tungsten, and aluminum; and the like.

Among these, at least one ion selected from the group consisting of ions of hydrogen, oxygen, nitrogen, rare gas, and fluorocarbons is preferable due to ease of implantation and a capability to form an implanted layer that exhibits an excellent gas barrier capability and excellent transparency. It is particularly preferable to use ions of nitrogen, oxygen, argon, or helium.

The ion implantation method is not particularly limited. For example, a method that includes forming a polyorganosiloxane compound-containing layer, and implanting ions into the polyorganosiloxane compound-containing layer may be used.

Ions may be implanted by applying ions (ion beams) accelerated by an electric field, implanting ions present in plasma, or the like. It is preferable to use a plasma ion implantation method since a gas barrier formed article can be conveniently obtained.

Plasma ion implantation may be implemented by generating plasma in an atmosphere containing a plasma-generating gas (rare gas), and implanting ions (cation) into the surface area of the polyorganosiloxane compound-containing layer by applying a negative high-voltage pulse to the polyorganosiloxane compound-containing layer, for example.

Implantation of ions may be confirmed by subjecting the surface layer part of the gas barrier layer to elemental analysis by X-ray photoelectron spectroscopy (XPS).

The shape of the formed article of the present invention is not particularly limited. For example, the formed article may be in the shape of a film, a sheet, a rectangular parallelepiped, a polygonal prism, a tube, or the like. When using the formed article as an electronic device member (described later), the formed article is preferably in the shape of a film or a sheet. The thickness of the film may be appropriately determined depending on the desired application of the electronic device.

The formed article of the present invention may include only the implanted layer, or may also include an additional layer other than the implanted layer. The additional layer may be a single layer, or may include a plurality of identical or different layers. Examples of the additional layer include a substrate formed of a material other than the polyorganosiloxane compound.

The material for the additional layer is not particularly limited insofar as the application of the formed article is not hindered. Examples of the material for the additional layer include polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, acrylic resins, cycloolefin polymers, aromatic polymers, and the like.

Among these, polyesters, polyamides, or cycloolefin polymers are preferable due to excellent transparency and versatility. It is more preferable to use polyesters or cycloolefin polymers.

Examples of polyesters include polyethylene terephthalate, polybuthylene terephthalate, polyethylene naphthalate, polyallylate, and the like.

Examples of polyamides include wholly aromatic polyamides, nylon 6, nylon 66, nylon copolymers, and the like.

Examples of cycloolefin polymers include norbornene polymers, monocyclic olefin polymers, cyclic conjugated diene polymers, vinyl alicyclic hydrocarbon polymers, and hydrogenated products thereof. Specific examples of cycloolefin polymers include Apel (ethylene-cycloolefin copolymer manufactured by Mitsui Chemicals Inc.), Arton (norbornene polymer manufactured by JSR Corporation), Zeonor (norbornene polymer manufactured by Zeon Corporation), and the like.

When the formed article of the present invention is a laminate that includes the additional layer, the implanted layer may be situated at an arbitrary position, but preferably forms the surface of the formed article from the viewpoint of production efficiency and the like. When the implanted layer forms the surface of the formed article, the implanted layer may be formed on one side of the additional layer, or may be formed on each side of the additional layer.

The formed article of the present invention exhibits an excellent gas barrier capability and excellent transparency. When the formed article is formed in the shape of a film or a sheet (hereinafter referred to as "film-shaped"), the formed article preferably maintains the gas barrier capability even if the formed article is folded.

Whether or not the formed article maintains the gas barrier capability when the formed article is folded may be determined by bending the film-shaped formed article, applying a pressure to the film-shaped formed article, and determining whether or not the fold has deteriorated when unfolding the film-shaped formed article. The film-shaped formed article of the present invention advantageously maintains the gas barrier capability as compared with an inorganic film having an identical thickness.

The formed article of the present invention exhibits an excellent gas barrier capability since the formed article has a low gas (e.g., steam) permeability. For example, the water vapor transmission rate of the formed article is preferably 5 g/m²/day or less, and more preferably 3 g/m²/day or less. The gas (e.g., steam) permeability of the formed article may be measured using a known gas permeability measuring device.

The formed article of the present invention exhibits excellent transparency since the formed article has a high visible light transmittance. The visible light transmittance (total light transmittance) of the formed article is preferably 80% or more, and more preferably 85% or more. The visible light transmittance of the formed article may be measured using a known visible light transmittance measuring device.

2) Method of Producing Formed Article

A method of producing a formed article of the present invention includes implanting ions into a polyorganosiloxane compound-containing layer of a formed body that includes the polyorganosiloxane compound-containing layer in its surface area.

In the method of producing a formed article of the present invention, it is preferable to implant ions into the polyorganosiloxane compound-containing layer while transferring a long formed body that includes the polyorganosiloxane compound-containing layer in its surface area in a given direction.

According to this method, ions can be implanted into a long formed body rolled out from a feed roll and transferred in a given direction, which can then be wound around a wind-up roll, for example. Therefore, an ion-implanted formed article can be continuously produced.

The long formed body is in the shape of a film. The formed body may include only the polyorganosiloxane compound-containing layer, or may also include an additional layer other than the polyorganosiloxane compound-containing layer. Examples of the additional layer include a substrate formed of a material other than the polyorganosiloxane compound. The additional layer mentioned above may be used.

The thickness of the formed body is preferably 1 to 500 μm, and more preferably 5 to 300 μm, from the viewpoint of winding/unwinding capability and transferability.

Ions may be implanted into the polyorganosiloxane compound-containing layer by an arbitrary method. It is preferable to form an ion-implanted layer in the surface layer part of the polyorganosiloxane compound-containing layer by a plasma ion implantation method.

The plasma ion implantation method includes implanting ions present in plasma into the surface area in the polyorganosiloxane compound-containing layer by applying a negative high-voltage pulse to the formed body that includes the polyorganosiloxane compound-containing layer in its surface area and is exposed to plasma.

As the plasma ion implantation method, it is preferable to use (A) a method that implants ions present in plasma generated by utilizing an external electric field into the surface layer part of the polyorganosiloxane compound-containing layer, or (B) a method that implants ions present in plasma generated by utilizing only an electric field produced by applying a negative high-voltage pulse to the polyorganosiloxane compound-containing layer without utilizing an external electric field into the surface layer part of the polyorganosiloxane compound-containing layer.

When using the method (A), it is preferable to set the pressure during ion implantation (pressure during plasma ion implantation) to 0.01 to 1 Pa. If the pressure during plasma ion implantation is within the above range, a uniform implanted layer can be formed conveniently and efficiently. This makes it possible to efficiently form an implanted layer that exhibits transparency and a gas barrier capability.

The method (B) does not require increasing the degree of decompression, allows a convenient operation, and significantly reduces the processing time. Moreover, the entire polyorganosiloxane compound-containing layer can be uniformly processed, and ions present in plasma can be continuously implanted into the surface area of the polyorganosiloxane compound-containing layer with high energy when applying a negative high-voltage pulse. The method (B) also has an advantage in that an implanted layer can be uniformly formed in the surface layer part of the polyorganosiloxane compound-containing layer by merely applying a negative high-voltage pulse to the polyorganosiloxane compound-containing layer without requiring a special means such as a high-frequency power supply (e.g., radio frequency (RF) power supply or microwave power supply).

When using the method (A) or (B), the pulse width when applying a negative high-voltage pulse (i.e., during ion implantation) is preferably 1 to 15 μsec. If the pulse width is within the above range, a transparent and uniform implanted layer can be formed more conveniently and efficiently.

The voltage applied when generating plasma is preferably −1 to −50 kV, more preferably −1 to −30 kV, and particularly preferably −5 to −20 kV. If the applied voltage is higher than −1 kV, the dose of the implanted ions may be insufficient, so that the desired performance may not be obtained. If the applied voltage is lower than −50 kV, the formed article may be charged during ion implantation, or the formed article may be colored.

Examples of ions implanted include rare gases such as argon, helium, neon, krypton, and xenon; ions of fluorocarbons, hydrogen, nitrogen, oxygen, carbon dioxide, chlorine, fluorine, sulfur, and the like; ions of conductive metals such as gold, silver, copper, platinum, nickel, palladium, chromium, titanium, molybdenum, niobium, tantalum, tungsten, and aluminum; and the like. Among these, ions of hydrogen, oxygen, nitrogen, rare gas, and fluorocarbons are preferable due to ease of ion implantation and a capability to form a formed article that exhibits transparency and an excellent gas barrier capability. It is more preferable to use ions of nitrogen, oxygen, argon, or helium.

A plasma ion implantation apparatus is used when implanting ions present in plasma into the surface layer part of the polyorganosiloxane compound-containing layer.

Specific examples of the plasma ion implantation apparatus include (a) an apparatus that causes the polyorganosiloxane compound-containing layer (hereinafter may be referred to as "ion implantation target layer") to be evenly enclosed by plasma by superimposing high-frequency power on a feedthrough that applies a negative high-voltage pulse to the ion implantation target layer so that ions present in plasma are attracted, implanted, collide, and deposited (JP-A-2001-26887), (β) an apparatus that includes an antenna in a chamber, wherein high-frequency power is applied to generate plasma, positive and the negative pulses are alternately applied to the ion implantation target layer after plasma has reached an area around the ion implantation target layer, so that ions present in plasma are attracted and implanted by heating the ion implantation target layer by causing electrons present in plasma to be attracted and collide due to the positive pulse, and applying the negative pulse while controlling the temperature by controlling the pulse factor (JP-A-2001-156013), (γ) a plasma ion implantation apparatus that generates plasma using an external electric field (e.g., microwave high-frequency power supply), and causes ions present in plasma to be attracted and implanted by applying a high-voltage pulse, (δ) a plasma ion implantation apparatus that implants ions present in plasma generated by using only an electric field produced by applying a high-voltage pulse without using an external electric field, and the like.

It is preferable to use the plasma ion implantation apparatus (γ) or (δ) since the plasma ion implantation apparatus (γ) or (δ) allows a convenient operation, significantly reduces the processing time, and can be continuously used.

A method using the plasma ion implantation apparatus (γ) or (δ) is described in detail below with reference to the drawings.

FIG. 1 is a view schematically showing a continuous plasma ion implantation apparatus that includes the plasma ion implantation apparatus (γ).

In FIG. 1(a), reference sign 1a indicates a long film-shaped formed body (hereinafter referred to as "film") that includes a polyorganosiloxane compound-containing layer in its surface area, reference sign 2a indicates a high-voltage rotary can, reference sign 3a indicates a feed roll around which the film 1a is wound before ion implantation, reference sign 4 indicates a plasma discharge electrode (external electric field), reference sign 5a indicates a wind-up roll around which an ion-implanted film (formed article) 1b is wound, reference sign 6a indicates a transfer roll, reference sign 7a indicates a high-voltage pulse power supply, reference sign 10a indicates a gas inlet, reference sign 11a indicates a chamber, and reference sign 20a indicates an oil diffusion pump. FIG. 1(b) is a perspective view showing the high-voltage rotary can 2a.

Reference sign 13 indicates a center shaft, and reference sign 15 indicates a high-voltage application terminal (feedthrough).

The long film 1a used in this embodiment that includes a polyorganosiloxane compound-containing layer in its surface area is a film in which a polyorganosiloxane compound-containing layer is formed on a substrate (additional layer).

In the continuous plasma ion implantation apparatus shown in FIG. 1, the film 1a is transferred from the feed roll 3a in an arrow direction X inside the chamber 11a, passes through the high-voltage rotary can 2a, and is wound around the wind-up roll 5a. The film 1a may be wound and transferred by an arbitrary method. In this embodiment, the film 1a is transferred by rotating the high-voltage rotary can 2a at a constant speed. The high-voltage rotary can 2a is rotated by rotating the center shaft 13 of the high-voltage application terminal 15 using a motor.

The high-voltage application terminal 15, the transfer rolls 6a that come in contact with the film 1a, and the like are formed of an insulator. For example, the high-voltage application terminal 15, the transfer rolls 6a, and the like are formed by coating the surface of alumina with a resin (e.g., polytetrafluoroethylene). The high-voltage rotary can 2a is formed of a conductor (e.g., stainless steel).

The transfer speed of the film 1a may be appropriately set. The transfer speed of the film 1a is not particularly limited insofar as ions are implanted into the surface area (polyorganosiloxane compound-containing layer) of the film 1a so that the desired implanted layer is formed when the film 1a is transferred from the feed roll 3a and wound around the wind-up roll 5a. The film winding speed (line speed) is determined depending on the applied voltage, the size of the apparatus, and the like, but is normally 0.1 to 3 m/min, and preferably 0.2 to 2.5 m/min.

The pressure inside the chamber 11a is reduced by discharging air from the chamber 11a using the oil diffusion pump 20a connected to a rotary pump. The degree of decompression is normally $1 \times 10^{-2}$ Pa or less, and preferably $1 \times 10^{-3}$ Pa or less.

An ion implantation gas is introduced into the chamber 11a through the gas inlet 10a so that the chamber 11a is filled with the ion implantation gas under reduced pressure.

Plasma is then generated using the plasma discharge electrode 4 (external electric field). Plasma may be generated using a known method (e.g., microwave or RF high-frequency power supply).

A negative high-voltage pulse 9a is applied from the high-voltage pulse power supply 7a connected to the high-voltage rotary can 2a through the high-voltage application terminal 15. When a negative high-voltage pulse is applied to the high-voltage rotary can 2a, ions present in plasma are attracted, and implanted into the surface area of the film around the high-voltage rotary can 2a (arrow Y in FIG. 1(a)) so that a formed article 1b that includes a gas barrier layer is obtained.

The pressure during ion implantation (i.e., the pressure of plasma gas inside the chamber 11a) is preferably 0.01 to 1 Pa. The pulse width during ion implantation is preferably 1 to 15 μsec. The applied voltage when applying a negative high voltage to the high-voltage rotary can 2a is preferably −1 to −50 kV.

Figure 2:
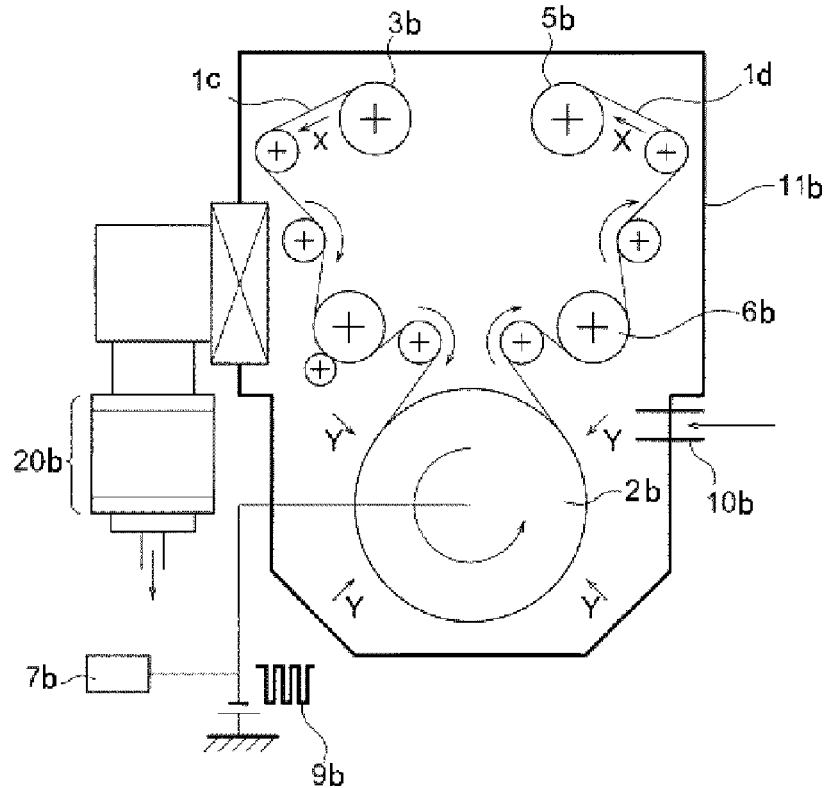
FIG. 2 is a view showing a schematic configuration of a plasma ion implantation apparatus.
Figure 3:
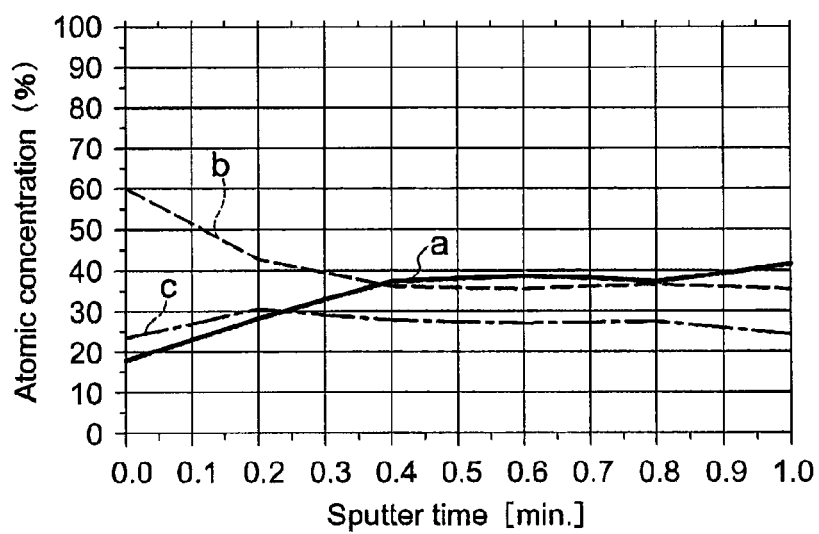
FIG. 3 is a view showing the oxygen atom content (%), the carbon atom content (%), and the silicon atom content (%) in the gas barrier layer of the formed article 1 of Example 1.
Figure 4:
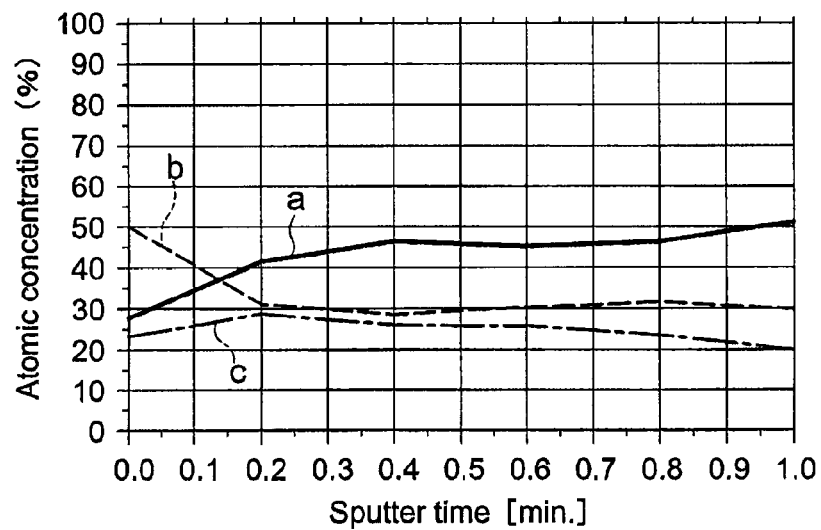
FIG. 4 is a view showing the oxygen atom content (%), the carbon atom content (%), and the silicon atom content (%) in the gas barrier layer of the formed article 2 of Example 2.
Figure 5:
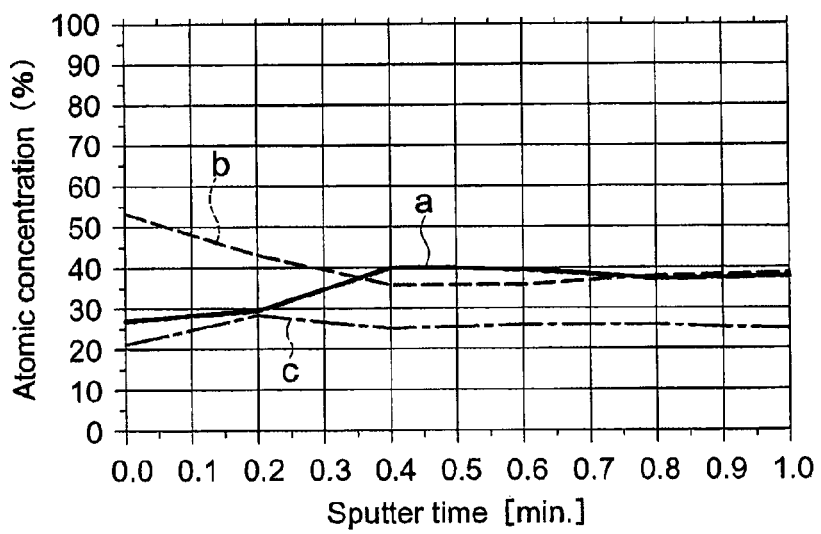
FIG. 5 is a view showing the oxygen atom content (%), the carbon atom content (%), and the silicon atom content (%) in the gas barrier layer of the formed article 3 of Example 3.
Figure 6:
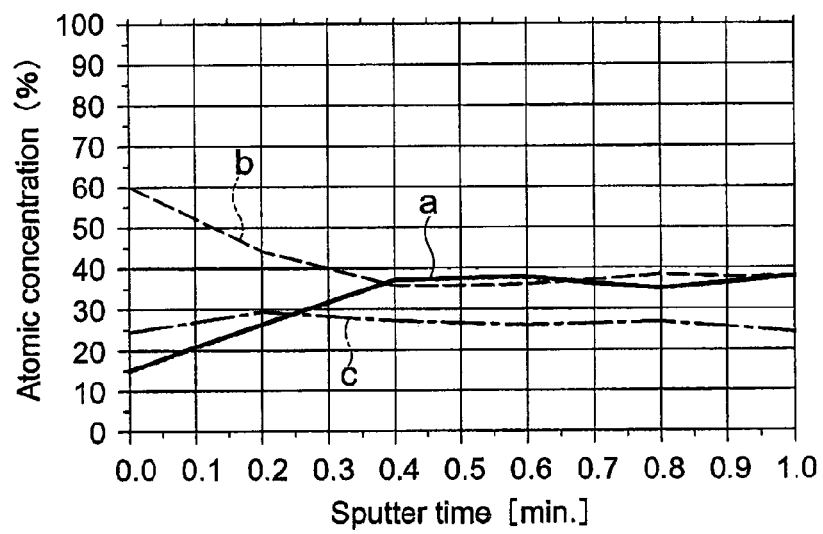
FIG. 6 is a view showing the oxygen atom content (%), the carbon atom content (%), and the silicon atom content (%) in the gas barrier layer of the formed article 4 of Example 4.
Figure 7:
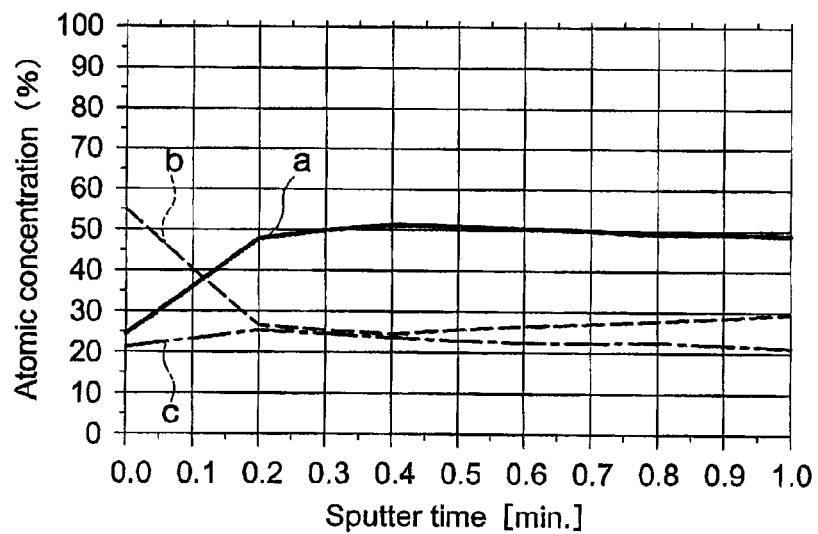
FIG. 7 is a view showing the oxygen atom content (%), the carbon atom content (%), and the silicon atom content (%) in the gas barrier layer of the formed article 5 of Example 5.
Figure 8:
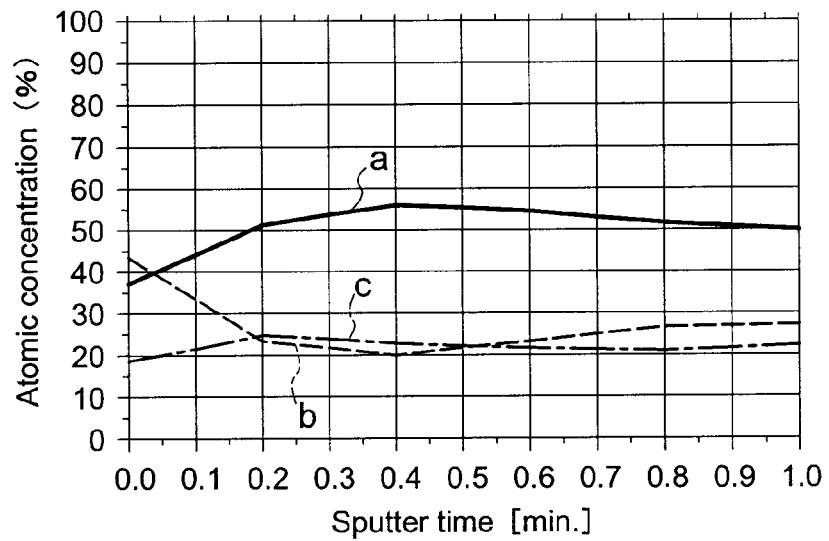
FIG. 8 is a view showing the oxygen atom content (%), the carbon atom content (%), and the silicon atom content (%) in the gas barrier layer of the formed article 6 of Example 6.
Figure 9:
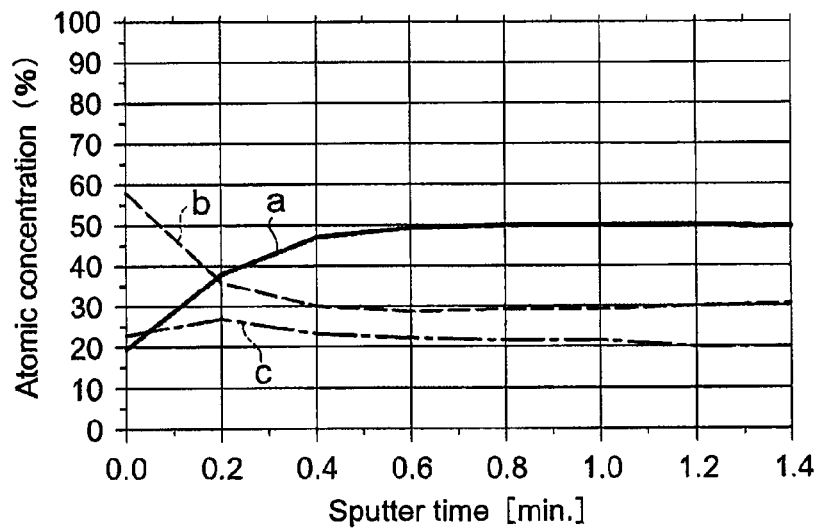
FIG. 9 is a view showing the oxygen atom content (%), the carbon atom content (%), and the silicon atom content (%) in the gas barrier layer of the formed article 7 of Example 7.
Figure 10:
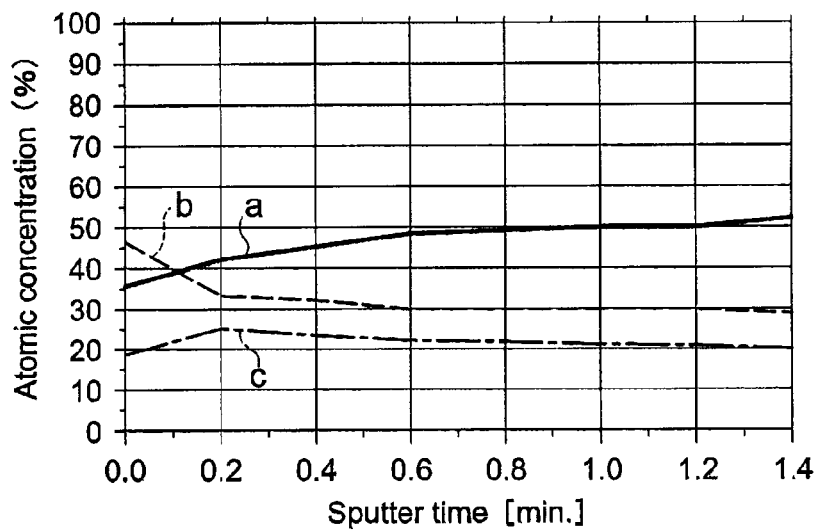
FIG. 10 is a view showing the oxygen atom content (%), the carbon atom content (%), and the silicon atom content (%) in the gas barrier layer of the formed article 8 of Example 8.
Figure 11:
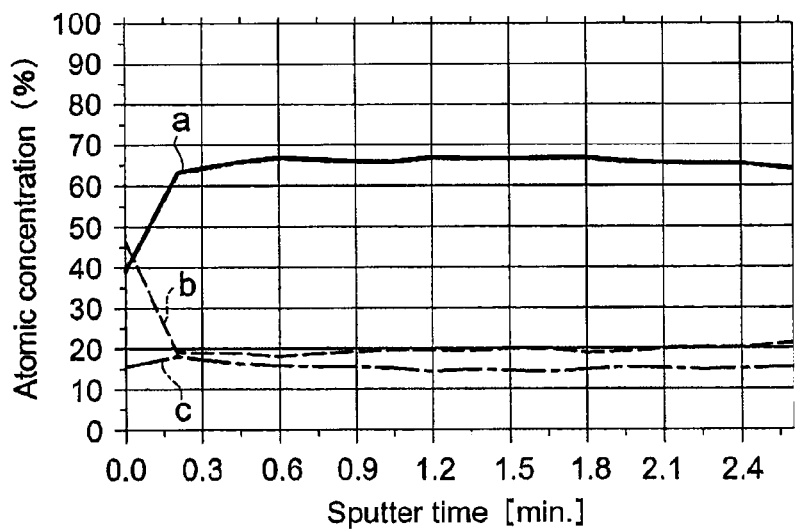
FIG. 11 is a view showing the oxygen atom content (%), the carbon atom content (%), and the silicon atom content (%) in the gas barrier layer of the formed article 9 of Example 9.
Figure 12:
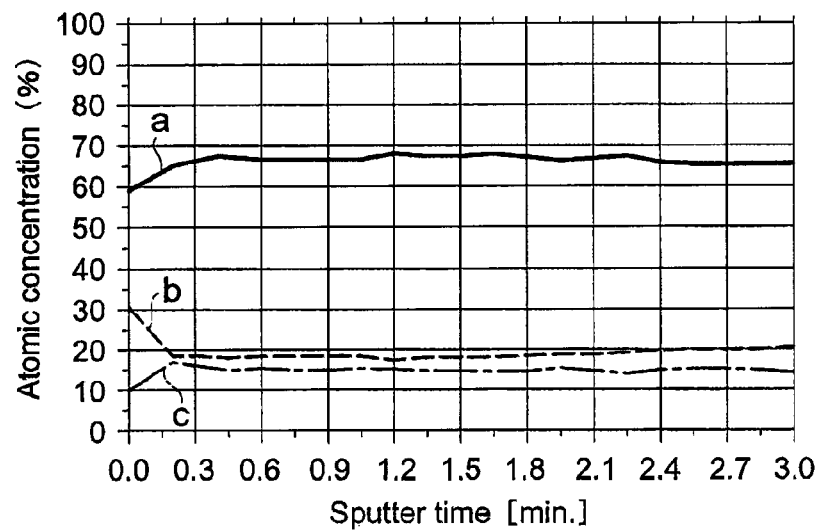
FIG. 12 is a view showing the oxygen atom content (%), the carbon atom content (%), and the silicon atom content (%) in the gas barrier layer of the formed article 10 of Example 10.

A method of implanting ions into a polyorganosiloxane compound-containing layer of a film that includes the polyorganosiloxane compound-containing layer in its surface area using a continuous plasma ion implantation apparatus shown in FIG. 2 is described below.

The apparatus shown in FIG. 2 includes the plasma ion implantation apparatus (δ). The plasma ion implantation apparatus (δ) generates plasma by using only an electric field produced by applying a high-voltage pulse without using an external electric field (i.e., the plasma discharge electrode 4 shown in FIG. 1).

In the continuous plasma ion implantation apparatus shown in FIG. 2, a film 1c (film-shaped formed body) is transferred from a feed roll 3b in an arrow direction X shown in FIG. 2 by rotating a high-voltage rotary can 2b, passes through transfer rolls 6b, and is wound around a wind-up roll 5b in the same manner as the apparatus shown in FIG. 1.

The continuous plasma ion implantation apparatus shown in FIG. 2 implants ions into the surface area of the polyorganosiloxane compound-containing layer of the film as follows.

The film 1c is placed in a chamber 11b in the same manner as the plasma ion implantation apparatus shown in FIG. 1. The pressure inside the chamber 11b is reduced by discharging air from the chamber 11b using an oil diffusion pump 20b connected to a rotary pump.

An ion implantation gas is introduced into the chamber 11b through a gas inlet 10b so that the chamber 11b is filled with the ion implantation gas under reduced pressure.

The pressure during ion implantation (i.e., the pressure of plasma gas inside the chamber 11b) is 10 Pa or less, preferably 0.01 to 5 Pa, and more preferably 0.01 to 1 Pa.

A high-voltage pulse 9b is applied from a high-voltage pulse power supply 7b connected to the high-voltage rotary can 2b while transferring the film 1b in the direction X shown in FIG. 2.

When a negative high-voltage pulse is applied to the high-voltage rotary can 2b, plasma is generated along the film 1c positioned around the high-voltage rotary can 2b, and ions present in plasma are attracted, and implanted into the surface area of the film 1c around the high-voltage rotary can 2b (arrow Y in FIG. 2). When ions have been implanted into the surface layer part of the polyorganosiloxane compound-containing layer of the film 1b, an implanted layer is formed in the surface layer part of the film. A formed article 1d that includes a gas barrier layer is thus obtained.

The applied voltage and the pulse width when applying a negative high voltage to the high-voltage rotary can 2b are the same as those of the continuous plasma ion implantation apparatus shown in FIG. 1.

In the plasma ion implantation apparatus shown in FIG. 2, since the high-voltage pulse power supply also serves as a plasma generation means, a special means such as a high-frequency power supply (e.g., RF power supply or microwave power supply) is unnecessary. An implanted layer can be continuously formed by implanting ions present in plasma into the surface layer part of the polyorganosiloxane compound-containing layer by merely applying a negative high-voltage pulse. Therefore, a formed article in which an implanted layer is formed in the surface layer part of a film can be mass-produced.

The formed article of the present invention may also be produced by subjecting the surface of the polyorganosiloxane compound-containing layer to plasma processing. In this case, hydrogen, oxygen, nitrogen, rare gas (e.g., helium, argon, or neon), or the like is used as a plasma-generating gas, and the polyorganosiloxane compound-containing layer is exposed to plasma generated by applying an external electric field, for example. Plasma processing is normally performed at a plasma-generating gas flow rate of 1 to 100 ml/min, a pressure of 0.1 to 50 Pa, and a temperature of 20 to 50° C. for 1 to 20 minutes.

3) Electronic Device Member and Electronic Device

An electronic device member of the present invention includes the formed article of the present invention. Since the electronic device member of the present invention exhibits an excellent gas barrier capability and excellent transparency, a deterioration in an element due to gas (e.g., steam) can be prevented. Since the electronic device member exhibits excellent light transmittance, the electronic device member may be suitably used as a display member for liquid crystal displays, electroluminescence displays, and the like; a solar battery backsheet; and the like.

An electronic device of the present invention includes the electronic device member of the present invention. Specific examples of the electronic device include a liquid crystal display, an organic EL display, an inorganic EL display, electronic paper, a solar battery, and the like.

Since the electronic device of the present invention includes the electronic device member that includes the formed article of the present invention, the electronic device exhibits an excellent gas barrier capability and excellent transparency.

EXAMPLES

The present invention is further described below by way of examples. Note that the present invention is not limited to the following examples.

A plasma ion implantation apparatus, an X-ray photoelectron spectroscopy (XPS) measuring device, X-ray photoelectron spectroscopy measurement conditions, a water vapor transmission rate measuring device, water vapor transmission rate measurement conditions, a visible light transmittance measuring device, and a folding test method used in the examples are as follows. An apparatus that implants ions using an external electric field was used as the plasma ion implantation apparatus.

(Plasma Ion Implantation Apparatus)
RF power supply: "RF56000" manufactured by JEOL Ltd.
High-voltage pulse power supply: "PV-3-HSHV-0835" manufactured by Kurita Seisakusho Co., Ltd.
(X-Ray Photoelectron Spectroscopy Measuring Device)
Measuring Device: "Phi Quantera Sxm" Manufactured by Ulvac-Phi, Incorporated
X-ray beam diameter: 100 μm
Electric power: 25 W
Voltage: 15 kV
Take-off angle: 45°

The following measurements (1) and (2) were performed under the above measurement conditions.
(1) Measurement of Implanted Ions The presence or absence of ions implanted into the surface of the formed articles of Examples 1, 2, 5 to 15, and 18 and Comparative Example 2 subjected to plasma ion implantation was determined.
(2) Measurement of Oxygen Atom Content, Carbon Atom Content, Silicon Atom Content, and Silicon Atom 2p Electron Binding Energy Peak Position The oxygen atom content, the carbon atom content, the silicon atom content, and the silicon atom 2p electron binding energy peak position in the surface of the formed articles of Examples 1 to 10 subjected to plasma ion implantation, the surface of the formed article of Example 19 subjected to plasma processing, and the surface of the polydimethylsiloxane-containing layer of the formed article of Comparative Example 1 were measured. The plasma ion-implanted surface (Examples 1 to 10), the plasma-processed surface of the polydimethylsiloxane-containing layer (Example 19), or the surface of the polydimethylsiloxane-containing layer (Comparative Example 1) of each formed article was sputtered using argon gas in the depth direction, and the oxygen atom content, the carbon atom content, and the silicon atom content in the surface exposed by sputtering were measured. This operation was repeated to measure the oxygen atom content, the carbon atom content, the silicon atom content, and the silicon atom 2p electron binding energy peak position.

The applied voltage during sputtering using argon gas was −4 kV. The sputtering time per once was 12 seconds. The sputtering rate was 100 nm/min (Examples 1 to 6 and 19 and Comparative Example 1), 70 nm/min (Examples 7 and 8), or 30 nm/min (Examples 9 and 10).

The oxygen atom content, the carbon atom content, and the silicon atom content were calculated from the peak area of each atom with respect to the total peak area (=100%) of an oxygen atom, a carbon atom, and a silicon atom.

(Water Vapor Transmission Rate Measuring Device)
Permeability meter: "L80-5000" manufactured by LYSSY
Relative humidity and temperature: 90% and 40° C.
(Visible Light Transmittance Measuring Device)

The total light transmittance was measured using a haze meter ("NDH2000" manufactured by Nippon Denshoku Industries Co., Ltd.). The beam incident surface of the formed article was the ion-implanted surface (Examples 1 to 18 and Comparative Example 2), the plasma-processed surface (Example 19), the surface of the polydimethylsiloxane-containing layer (Comparative Example 1), or the surface of the silicon nitride film (Comparative Example 3).

(Folding Test)

The formed article was folded at the center so that the ion-implanted surface (Examples 1 to 18 and Comparative Example 2), the plasma-processed surface (Example 19), the surface of the polydimethylsiloxane-containing layer (Comparative Example 1), or the surface of the silicon nitride film (Comparative Example 3) was positioned outside. The formed article was passed between two rolls of a laminator ("LAMIPACKER LPC1502" manufactured by Fujipla, Inc.) at a laminate speed of 5 m/min and a temperature of 23° C. The folded area was observed using a microscope (magnification: 100) to determine the presence or absence of cracks, and the water vapor transmission rate of the formed article was measured.

Example 1

A silicone resin (A) (silicone release agent "KS835" manufactured by Shin-Etsu Chemical Co., Ltd.) containing a polydimethylsiloxane as the main component (polyorganosiloxane compound) was applied to a polyethylene terephthalate film (PET film) ("PET38T-300" manufactured by Toray Industries Inc., thickness: 38 μm) (substrate) using a Meyer bar. The silicone resin (A) was heated at 120° C. for 2 minutes to form a layer including the silicone release agent A (thickness: 100 nm). A formed body was thus obtained. Nitrogen ions were implanted into the surface of the polydimethylsiloxane-containing layer using the plasma ion implantation apparatus shown in FIG. 1 to obtain a formed article 1.

The plasma ion implantation conditions were as follows.
Plasma-generating gas: $N_2$
Duty ratio: 0.5%
Repetition frequency: 1000 Hz
Applied voltage: −10 kV
RF power supply: frequency: 13.56 MHz, applied electric power: 1000 W
Chamber internal pressure: 0.2 Pa
Pulse width: 5 msec
Processing time (ion implantation time): 5 minutes
Transfer speed: 0.4 m/min Example 2

A formed article 2 was obtained in the same manner as in Example 1, except for using argon (Ar) as the plasma-generating gas.

Example 3

A formed article 3 was obtained in the same manner as in Example 1, except for using helium (He) as the plasma-generating gas.

Example 4

A formed article 4 was obtained in the same manner as in Example 1, except for using oxygen ($O_2$) as the plasma-generating gas.

Example 5

A silicone resin (B) containing a polyorganosiloxane compound as the main component and having a structure in which some of the methyl groups of polydimethylsiloxane were substituted with a phenyl group ("X62-9201B" manufactured by Shin-Etsu Chemical Co., Ltd.) was applied to a PET film ("PET38T-300" manufactured by Toray Industries Inc.) using a Meyer bar. The silicone resin (B) was heated at 120° C. for 2 minutes to obtain a layer including a polyorganosiloxane including a phenyl group (thickness: 100 nm). A formed body was thus obtained. Nitrogen ions were implanted into the surface of the layer including the silicone resin (B) in the same manner as in Example 1 to obtain a formed article 5.

Example 6

A formed article 6 was obtained in the same manner as in Example 5, except for using argon (Ar) as the plasma-generating gas.

Example 7

3.29 g (20 mmol) of n-propyltrimethoxysilane (manufactured by Tokyo Chemical Industry Co., Ltd.), 4.73 g (20 mmol) of 3-glycidoxypropyltrimethoxysilane (manufactured by Tokyo Chemical Industry Co., Ltd.), 20 ml of toluene, 10 ml of distilled water, and 0.10 g (1 mmol) of phosphoric acid (manufactured by Kanto Chemical Co., Ltd.) were mixed, and reacted at room temperature for 24 hours. After completion of the reaction, a saturated aqueous solution of sodium hydrogen carbonate was added to the reaction mixture. After the addition of 100 ml of ethyl acetate, the organic layer was isolated preparatively. The organic layer was then washed twice with distilled water and dried over anhydrous magnesium sulfate, and magnesium sulfate was separated by filtration. The filtrate was added dropwise to a large quantity of n-hexane to effect precipitation. After separating n-hexane by decantation, the precipitate was dissolved in THF, and the solution was recovered. After evaporating tetrahydrofuran (THF) under reduced pressure using an evaporator, the residue was dried under vacuum to obtain polysilsesquioxane (polyorganosiloxane compound) having a ladder-like structure. The weight average molecular weight of the polysilsesquioxane was 2000. A solution (solid content: 2 mass %) prepared by dissolving the polysilsesquioxane in toluene was applied to a PET film ("PET38T-300" manufactured by Toray Industries Inc.) using a Meyer bar. The polysilsesquioxane was cured at 125° C. for 6 hours to obtain a formed body including a polysilsesquioxane layer (thickness: 100 nm). Nitrogen ions were implanted into the surface of the cured polysilsesquioxane layer in the same manner as in Example 1 to obtain a formed article 7. Note that the weight average molecular weight refers to a polystyrene-reduced weight average molecular weight measured by gel permeation chromatography (GPC). The water vapor transmission rate and the total light transmittance of the formed body before plasma ion implantation were 12.1 g/m$^2$/day and 89.10%, respectively.

Example 8

A formed article 13 was obtained in the same manner as in Example 7, except for using argon (Ar) as the plasma-generating gas.

Example 9

7.94 g (40 mmol) of phenyltrimethoxysilane (manufactured by Tokyo Chemical Industry Co., Ltd.), 20 ml of toluene, 10 ml of distilled water, and 0.10 g (1 mmol) of phosphoric acid (manufactured by Kanto Chemical Co., Ltd.) were mixed, and reacted at room temperature for 24 hours. After completion of the reaction, a saturated aqueous solution of sodium hydrogen carbonate was added to the reaction mixture. After the addition of 100 ml of ethyl acetate, the organic layer was isolated preparatively. The organic layer was then washed twice with distilled water and dried over anhydrous magnesium sulfate, and magnesium sulfate was separated by filtration. The filtrate was added dropwise to a large quantity of n-hexane to effect precipitation. After separating n-hexane by decantation, the precipitate was dissolved in THF, and the solution was recovered. After evaporating THF under reduced pressure using an evaporator, the residue was dried under vacuum to obtain polysilsesquioxane (polyorganosiloxane compound) having a ladder-like structure. The weight average molecular weight of the polysilsesquioxane was 1600. A solution (solid content: 2 mass %) prepared by dissolving the polysilsesquioxane in toluene was applied to a PET film ("PET38T-300" manufactured by Toray Industries Inc.) using a Meyer bar. The polysilsesquioxane was cured at 125° C. for 6 hours to obtain a formed body including a polysilsesquioxane layer (thickness: 100 nm). Nitrogen ions were implanted into the surface of the cured polysilsesquioxane layer in the same manner as in Example 1 to obtain a formed article 9. The water vapor transmission rate and the total light transmittance of the formed body before plasma ion implantation were 11.7 g/m$^2$/day and 86.05%, respectively.

Example 10

A formed article 10 was obtained in the same manner as in Example 9, except for using argon (Ar) as the plasma-generating gas.

Example 11

A formed article 11 was obtained in the same manner as in Example 1, except for changing the transfer speed to 0.2 m/min, and changing the processing time (ion implantation time) to 10 minutes.

Example 12

A formed article 12 was obtained in the same manner as in Example 11, except for using argon (Ar) as the plasma-generating gas.

Example 13

A formed article 13 was obtained in the same manner as in Example 2, except for changing the applied voltage to −5 kV.

Example 14

A formed article 14 was obtained in the same manner as in Example 2, except for changing the pulse width to 10 μsec.

Example 15

A formed article 15 was obtained in the same manner as in Example 1, except for changing the ion implantation conditions as follows.
Ion implantation conditions
Plasma-generating gas: Ar
Duty ratio: 1%
Repetition frequency: 1000 Hz
Applied voltage: −15 kV
RF power supply: frequency: 13.56 MHz, applied electric power: 1000 W
Chamber internal pressure: 0.2 Pa
Pulse width: 10 μsec
Processing time (ion implantation time): 1 minute
Transfer speed: 2 m/min

Example 16

A formed article 16 was obtained in the same manner as in Example 11, except for using helium as the plasma-generating gas.

Example 17

A formed article 17 was obtained in the same manner as in Example 11, except for using oxygen as the plasma-generating gas.

Example 18

3.97 g (20 mmol) of phenyltrimethoxysilane (manufactured by Tokyo Chemical Industry Co., Ltd.), 4.73 g (20 mmol) of 3-glycidoxypropyltrimethoxysilane (manufactured by Tokyo Chemical Industry Co., Ltd.), 20 ml of toluene, 10 ml of distilled water, and 0.10 g (1 mmol) of phosphoric acid (manufactured by Kanto Chemical Co., Ltd.) were mixed, and reacted at room temperature for 24 hours. After completion of the reaction, a saturated aqueous solution of sodium hydrogen carbonate was added to the reaction mixture. After the addition of 100 ml of ethyl acetate, the organic layer was isolated preparatively. The organic layer was then washed twice with distilled water and dried over anhydrous magnesium sulfate, and magnesium sulfate was separated by filtration. The filtrate was added dropwise to a large quantity of n-hexane to effect precipitation. After separating n-hexane by decantation, the precipitate was dissolved in THF, and the solution was recovered. After evaporating THF under reduced pressure using an evaporator, the residue was dried under vacuum to obtain polysilsesquioxane (polyorganosiloxane compound) having a ladder-like structure. The weight average molecular weight of the polysilsesquioxane was 1800. A solution (solid content: 20 mass %) prepared by dissolving the polysilsesquioxane in toluene was applied to a PET film ("PET38T-300" manufactured by Toray Industries Inc.) using a Meyer bar. The polysilsesquioxane was cured at 125° C. for 6 hours to obtain a formed body including a polysilsesquioxane layer (thickness: 10 μm). Argon ions were implanted into the surface of the cured polysilsesquioxane layer in the same manner as in Example 12 to obtain a formed article 18.

The water vapor transmission rate and the total light transmittance of the formed body before plasma ion implantation were 12 g/m$^2$/day and 90.00%, respectively.

Example 19

A formed article 19 was obtained by subjecting the surface of the polydimethylsiloxane-containing layer of the formed body of Example 1 to plasma processing under the following conditions instead of plasma ion implantation. Plasma processing apparatus: Plasma Dry Cleaner "PDC-210" manufactured by Yamato Material Co., Ltd.
High-frequency electric power: 300 W
Oscillation frequency: 13.56 MHz
Plasma-generating gas: argon
Gas flow rate: 50 ml/min
Processing pressure: 30 Pa
Processing temperature: 40° C.
Processing time: 3 min Comparative Example 1

A formed article was obtained in the same manner as in Example 1, except that ion implantation was not performed. Specifically, the polydimethylsiloxane-containing layer was formed on the PET film to obtain a formed article 20.

Comparative Example 2

A formed article was obtained in the same manner as in Example 1, except that the silicone release agent A was not applied to the PET film. Specifically, nitrogen ions were implanted into the surface of the PET film to obtain a formed article 21.

Comparative Example 3

A silicon nitride (SiN) film (thickness: 50 nm) was formed on a PET film by sputtering to obtain a formed article 22.

FIGS. 3 to 13 show the XPS elemental analysis results for the oxygen atom content, the carbon atom content, and the silicon atom content of the formed articles of Examples 1 to 10 and Comparative Example 1.

In FIGS. 3 to 13, the vertical axis indicates the oxygen atom content (%), the carbon atom content (%), and the silicon atom content (%) based on the total content (=100%) of oxygen atoms, carbon atoms, and silicon atoms, and the horizontal axis indicates the cumulative sputtering time (Sputter time (min)). Since the sputtering rate was constant, the cumulative sputtering time (Sputter time) corresponds to the depth. In FIGS. 3 to 13, a indicates the carbon atom content, b indicates the oxygen atom content, and c indicates the silicon atom content.

As shown in FIGS. 3 to 12, it was confirmed that the formed articles 1 to 10 had an area (gas barrier layer) where the oxygen atom content gradually decreases and the carbon atom content gradually increases from the surface in the depth direction. It was also confirmed that the formed article 19 had an area (gas barrier layer) where the oxygen atom content gradually decreases and the carbon atom content gradually increases from the surface in the depth direction.

Figure 13:
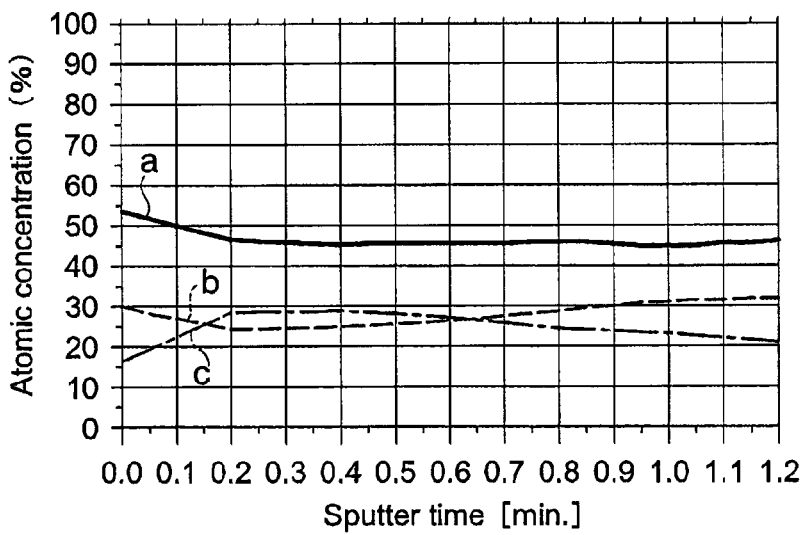
FIG. 13 is a view showing the oxygen atom content (%), the carbon atom content (%), and the silicon atom content (%) in the gas barrier layer of the formed article 19 of Comparative Example 1.

As shown in FIG. 13, the formed article 20 of Comparative Example 1 did not have the above area.

Table 1 shows the measurement results for the oxygen atom content, the carbon atom content, the silicon atom content, and the silicon atom 2p electron binding energy peak position in the surface layer part of the gas barrier layer (i.e., an area where the oxygen atom content gradually decreases and the carbon atom content gradually increases from the surface in the depth direction) of the formed articles of Examples 1 to 10 and 19. Note that the surface of the gas barrier layer of the formed articles of Examples 1 to 10 and 19 is the plasma ion-implanted surface or the plasma-processed surface. Therefore, the values measured for the plasma ion-implanted surface or the plasma-processed surface correspond to the oxygen atom content, the carbon atom content, the silicon atom content, and the silicon atom 2p electron binding energy peak position in the surface layer part of the gas barrier layer.

TABLE 1

| | Molded article | Content | | | Peak position (eV) |
| | | Oxygen atom (%) | Carbon atom (%) | Silicon atom (%) | |
|---|---|---|---|---|---|
| Example 1 | 1 | 59.6 | 17.5 | 22.9 | 103.0 |
| Example 2 | 2 | 49.7 | 27.4 | 22.9 | 103.3 |
| Example 3 | 3 | 52.9 | 26.5 | 20.6 | 103.1 |
| Example 4 | 4 | 60.3 | 15.3 | 24.4 | 103.1 |
| Example 5 | 5 | 54.5 | 24.3 | 21.2 | 103.1 |
| Example 6 | 6 | 44.0 | 37.4 | 18.6 | 103.0 |
| Example 7 | 7 | 58.1 | 19.3 | 22.6 | 103.0 |
| Example 8 | 8 | 46.3 | 35.4 | 18.3 | 103.0 |
| Example 9 | 9 | 46.0 | 38.8 | 15.2 | 102.9 |
| Example 10 | 10 | 30.8 | 58.9 | 10.3 | 102.9 |
| Example 19 | 19 | 63.3 | 11.2 | 25.5 | 103.3 |

As shown in Table 1, the formed articles 1 to 10 and 19 had a silicon atom 2p electron binding energy peak position of 102.9 to 103.3 eV.

Figure 14:
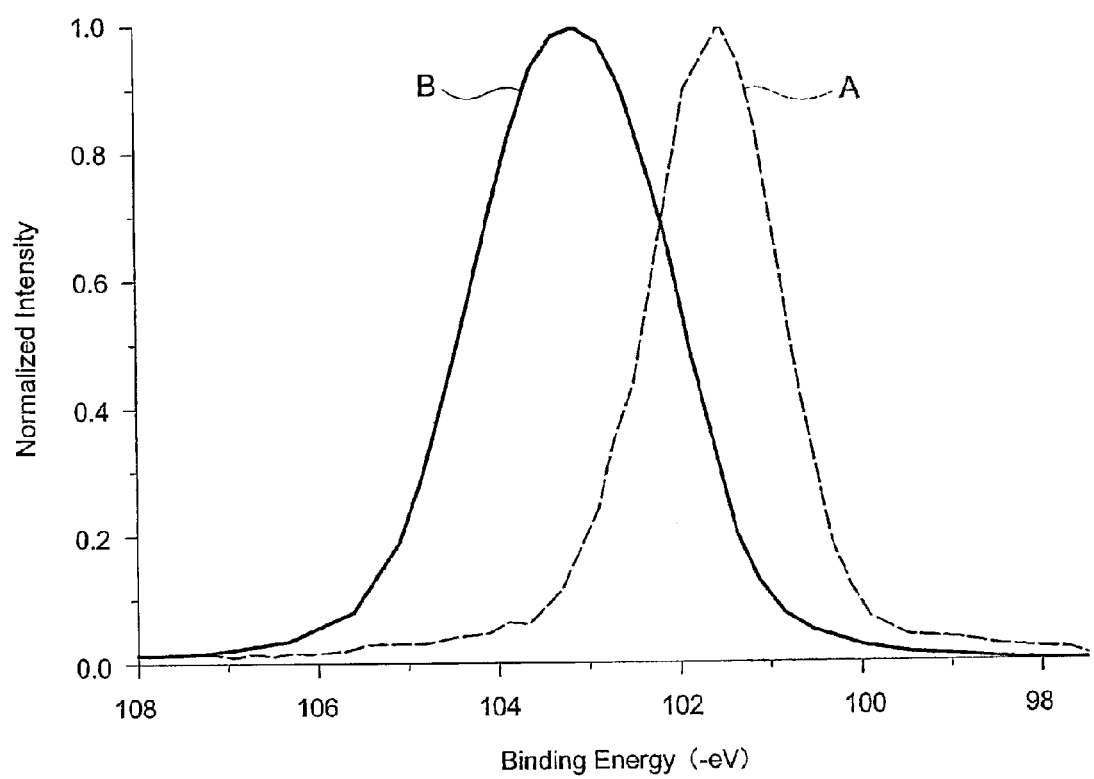
FIG. 14 is a view showing the XPS analysis results for the distribution of the silicon atom 2p electron binding energy of the formed article 2 of Example 2.

FIG. 14 shows the XPS analysis results for binding energy of 2p electron of the silicon atom of the formed article 2 of Example 2. In FIG. 14, the vertical axis indicates the peak intensity, and the horizontal axis indicates the binding energy (eV). As shown in FIG. 14, the formed article 2 had a silicon atom 2p electron binding energy peak position (B) of 103.3 eV. The silicon atom 2p electron binding energy peak position of the formed article 2 was 101.5 eV before ion implantation (corresponding to A (Comparative Example 1)), and shifted to the high energy side (103.3 eV).

The water vapor transmission rate and the total light transmittance of the formed articles 1 to 22 of Examples 1 to 19 and Comparative Examples 1 to 3 were measured using the water vapor transmission rate measuring device and the visible light transmittance measuring device. The measurement results are shown in Table 2.

TABLE 2

| | Molded article | Steam permeability (g/m$^2$/day) | Total light transmittance (%) |
|---|---|---|---|
| Example 1 | 1 | 0.40 | 88.51 |
| Example 2 | 2 | 0.30 | 88.36 |

TABLE 2-continued

| Molded article | Steam permeability (g/m²/day) | Total light transmittance (%) |
|---|---|---|
| Example 3 | 3 | 4.08 | 85.90 |
| Example 4 | 4 | 0.89 | 88.12 |
| Example 5 | 5 | 3.08 | 86.81 |
| Example 6 | 6 | 1.86 | 85.46 |
| Example 7 | 7 | 0.12 | 88.21 |
| Example 8 | 8 | 0.08 | 88.36 |
| Example 9 | 9 | 0.08 | 84.05 |
| Example 10 | 10 | 0.03 | 83.89 |
| Example 11 | 11 | 1.13 | 86.70 |
| Example 12 | 12 | 0.30 | 86.94 |
| Example 13 | 13 | 1.19 | 86.78 |
| Example 14 | 14 | 0.31 | 86.79 |
| Example 15 | 15 | 0.46 | 88.62 |
| Example 16 | 16 | 0.36 | 86.50 |
| Example 17 | 17 | 1.20 | 86.35 |
| Example 18 | 18 | 1.50 | 89.80 |
| Example 19 | 19 | 6.49 | 87.00 |
| Comparative Example 1 | 20 | 10.32 | 91.52 |
| Comparative Example 2 | 21 | 7.98 | 71.36 |
| Comparative Example 3 | 22 | 0.25 | 70.58 |

As shown in Table 2, the formed articles 1 to 19 of Examples 1 to 19 had a low water vapor transmission rate (i.e., excellent gas barrier capability) as compared with the formed articles 20 and 21 of Comparative Examples 1 and 2. The formed articles 1 to 19 had a high total light transmittance almost equal to that before ion implantation.

Each formed article was then subjected to the folding test.

The presence or absence of cracks of the formed articles 1 to 22 was visually observed after the folding test. The observation results are shown in Table 3.

The water vapor transmission rate of the formed articles 1 to 22 was measured after the folding test. The results are shown in Table 3.

TABLE 3

| Molded article | Cracks | Steam permeability (g/m²/day) |
|---|---|---|
| Example 1 | 1 | Did not occur | 0.93 |
| Example 2 | 2 | Did not occur | 0.90 |
| Example 3 | 3 | Did not occur | 4.95 |
| Example 4 | 4 | Did not occur | 1.58 |
| Example 5 | 5 | Did not occur | 4.21 |
| Example 6 | 6 | Did not occur | 2.13 |
| Example 7 | 7 | Did not occur | 0.41 |
| Example 8 | 8 | Did not occur | 0.26 |
| Example 9 | 9 | Did not occur | 0.19 |
| Example 10 | 10 | Did not occur | 0.10 |
| Example 11 | 11 | Did not occur | 1.80 |
| Example 12 | 12 | Did not occur | 0.86 |
| Example 13 | 13 | Did not occur | 1.91 |
| Example 14 | 14 | Did not occur | 0.86 |
| Example 15 | 15 | Did not occur | 1.18 |
| Example 16 | 16 | Did not occur | 0.93 |
| Example 17 | 17 | Did not occur | 1.58 |
| Example 18 | 18 | Did not occur | 1.95 |
| Example 19 | 19 | Did not occur | 6.98 |
| Comparative Example 1 | 20 | Did not occur | 10.92 |
| Comparative Example 2 | 21 | Did not occur | 8.07 |
| Comparative Example 3 | 22 | Occurred | 1.21 |

As shown in Table 3, the formed articles of Examples 1 to 19 did not produce cracks in the folding test, and showed a small increase in water vapor transmission rate as compared with the formed article of Comparative Example 3 in which the inorganic film was formed. Specifically, the formed articles of Examples 1 to 19 had excellent folding resistance.

INDUSTRIAL APPLICABILITY

The formed article according to the present invention may be suitably used as an electronic device member such as a flexible display member and a solar battery backsheet.

The method of producing a formed article according to the present invention can safely and conveniently produce the formed article according to the present invention that exhibits an excellent gas barrier capability.

Since the electronic device member according to the present invention exhibits an excellent gas barrier capability and excellent transparency, the electronic device member may be suitably used for electronic devices such as displays and solar batteries.

The invention claimed is:

1. A formed article comprising a substrate, a polyorganosiloxane compound-containing layer, and a gas barrier layer that is formed of a material that includes at least an oxygen atom, a carbon atom, and a silicon atom, wherein the gas barrier layer is formed in a surface area of the polyorganosiloxane compound-containing layer, the gas barrier layer having an oxygen atom content that decreases from a surface of the gas barrier layer in the depth direction, and having a carbon atom content that increases from the surface of the gas barrier layer in the depth direction, the surface layer part of the gas barrier layer has an oxygen atom content of 10 to 70%, a carbon atom content of 10 to 70%, and a silicon atom content of 5 to 35%, based on the total content of oxygen atoms, carbon atoms, and silicon atoms, and a depth of the gas barrier layer is 5 to 50 nm, wherein the polyorganosiloxane compound-containing layer has a thickness of 30 nm to 200 μm, wherein the formed article has a layer structure of the substrate/the polyorganosiloxane compound-containing layer/the gas barrier layer, wherein the surface layer part of the gas barrier layer has a peak position of binding energy of 2p electron of the silicon atom determined by X-ray photoelectron spectroscopy (XPS) of 102 to 104 eV, wherein the gas barrier layer is obtained by implanting ions into a polyorganosiloxane compound-containing layer, and wherein the polyorganosiloxane compound is a polyorganosiloxane shown by the following formula (b),

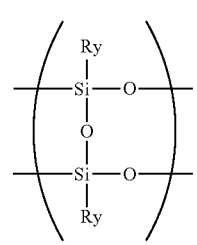

wherein Ry represents a hydrogen atom or a non-hydrolyzable group such as a substituted or unsubstituted alkyl group, a substituted or unsubstituted alkenyl group, or a substituted or unsubstituted aryl group, and a plurality of Ry in the formula (b) may respectively be either the same or different.

2. The formed article according to claim 1, wherein the ions have been implanted into a surface layer part of the polyorganosiloxane compound-containing layer.

3. The formed article according to claim 1, wherein the ions have been obtained by ionizing at least one gas selected from the group consisting of hydrogen, nitrogen, oxygen, rare gas, and fluorocarbons.

4. The formed article according to claim 1, wherein the ions have been implanted by plasma ion implantation.

5. An electronic device member comprising the formed article according to claim 1.

6. An electronic device comprising the electronic device member according to claim 5.

7. The formed article according to claim 1, wherein the surface layer part of the gas barrier layer has an oxygen atom content of 44 to 70%, a carbon atom content of 10 to 70%, and a silicon atom content of 5 to 35%, based on the total content of oxygen atoms, carbon atoms, and silicon atoms.

* * * * *